(12) United States Patent
Colgrove et al.

(10) Patent No.: US 9,836,234 B2
(45) Date of Patent: Dec. 5, 2017

(54) STORAGE CLUSTER

(71) Applicant: Pure Storage, Inc., Mountain View, CA (US)

(72) Inventors: John Colgrove, Mountain View, CA (US); John D. Davis, Mountain View, CA (US); John Martin Hayes, Mountain View, CA (US); Robert Lee, Mountain View, CA (US)

(73) Assignee: Pure Storage, Inc., Mountain View, CA (US)

(*) Notice: Subject to any disclaimer, the term of this patent is extended or adjusted under 35 U.S.C. 154(b) by 27 days.

(21) Appl. No.: 15/146,681

(22) Filed: May 4, 2016

(65) Prior Publication Data
US 2016/0246528 A1 Aug. 25, 2016

Related U.S. Application Data

(63) Continuation-in-part of application No. 14/491,552, filed on Sep. 19, 2014, now Pat. No. 9,563,506, which
(Continued)

(51) Int. Cl.
*G06F 3/06* (2006.01)
*G06F 12/02* (2006.01)
(Continued)

(52) U.S. Cl.
CPC .............. *G06F 3/0622* (2013.01); *G06F 3/06* (2013.01); *G06F 3/0613* (2013.01);
(Continued)

(58) Field of Classification Search
CPC ........ G06F 3/0622; G06F 3/06; G06F 3/0613; G06F 3/0637; G06F 3/0655;
(Continued)

(56) References Cited

U.S. PATENT DOCUMENTS 5,390,327 A 2/1995 Lubbers et al.
5,479,653 A 12/1995 Jones
(Continued)

FOREIGN PATENT DOCUMENTS

| | | |
|---|---|---|
| EP | 2164006 | 3/2010 |
| WO | WO 02-13033 | 2/2002 |
| WO | WO 2008103569 | 8/2008 |

OTHER PUBLICATIONS

Storer, Mark W., Greenan, Kevin M., Miller, L. Ethan, Voruganti, Kaladhar; Pergamum: Replacing Tape with Energy Efficient, Reliable, Disk-Based Archival Storage; Fast '08: 6th UNISEX Conference on File and Storage Technologies. 2008.
(Continued)

*Primary Examiner* — Stephen Elmore
(74) *Attorney, Agent, or Firm* — Womble Bond Dickinson

(57) ABSTRACT

A method for managing processing power in a storage system is provided. The method includes providing a plurality of blades, each of a first subset having a storage node and storage memory, and each of a second, differing subset having a compute-only node. The method includes distributing authorities across the plurality of blades, to a plurality of nodes including at least one compute-only node, wherein each authority has ownership of a range of user data.

20 Claims, 9 Drawing Sheets

Related U.S. Application Data is a continuation of application No. 14/296,151, filed on Jun. 4, 2014, now Pat. No. 8,850,108.

(51) Int. Cl.
*G06F 11/10* (2006.01)
*H03M 13/15* (2006.01)

(52) U.S. Cl.
CPC .......... *G06F 3/0637* (2013.01); *G06F 3/0655* (2013.01); *G06F 3/0688* (2013.01); *G06F 11/108* (2013.01); *G06F 11/1068* (2013.01); *G06F 11/1076* (2013.01); *G06F 11/1092* (2013.01); *G06F 12/0246* (2013.01); *H03M 13/154* (2013.01); *G06F 2201/845* (2013.01); *G06F 2212/7206* (2013.01); *G06F 2212/7207* (2013.01)

(58) Field of Classification Search
CPC ............... G06F 3/0688; G06F 11/1068; G06F 11/1076; G06F 11/108; G06F 11/1092; G06F 12/0246; H03M 13/154
USPC ............. 711/103, 154, 156, 170; 365/185.33
See application file for complete search history.

(56) References Cited

U.S. PATENT DOCUMENTS

| | | |
|---|---|---|
| 5,649,093 A | 7/1997 | Hanko et al. |
| 6,275,898 B1 | 8/2001 | DeKoning |
| 6,643,748 B1 | 11/2003 | Wieland |
| 6,725,392 B1 | 4/2004 | Frey et al. |
| 6,985,995 B2 | 1/2006 | Holland et al. |
| 7,069,383 B2 | 6/2006 | Yamamoto et al. |
| 7,076,606 B2 | 7/2006 | Orsley |
| 7,107,480 B1 | 9/2006 | Moshayedi et al. |
| 7,159,150 B2 | 1/2007 | Kenchammana-Hosekote |
| 7,162,575 B2 | 1/2007 | Dalal et al. |
| 7,334,156 B2 | 2/2008 | Land et al. |
| 7,370,220 B1 | 5/2008 | Nguyen et al. |
| 7,444,532 B2 | 10/2008 | Masuyama et al. |
| 7,480,658 B2 | 1/2009 | Heinla et al. |
| 7,558,859 B2 | 7/2009 | Kasiolas |
| 7,613,947 B1 | 11/2009 | Coatney |
| 7,681,104 B1 | 3/2010 | Sim-Tang et al. |
| 7,681,105 B1 | 3/2010 | Sim-Tang et al. |
| 7,730,258 B1 | 6/2010 | Smith |
| 7,743,276 B2 | 6/2010 | Jacobson et al. |
| 7,757,038 B2 | 7/2010 | Kitahara |
| 7,778,960 B1 | 8/2010 | Chatterjee et al. |
| 7,814,272 B2 | 10/2010 | Barrall et al. |
| 7,814,273 B2 | 10/2010 | Barrall |
| 7,818,531 B2 | 10/2010 | Barrall |
| 7,827,351 B2 | 11/2010 | Suetsugu et al. |
| 7,827,439 B2 | 11/2010 | Mathew et al. |
| 7,870,105 B2 | 1/2011 | Arakawa et al. |
| 7,885,938 B1 | 2/2011 | Greene et al. |
| 7,886,111 B2 | 2/2011 | Klemm et al. |
| 7,908,448 B1 | 3/2011 | Chatterjee et al. |
| 7,941,697 B2 | 5/2011 | Mathew et al. |
| 7,958,303 B2 | 6/2011 | Shuster |
| 7,971,129 B2 | 6/2011 | Watson |
| 8,010,485 B1 | 8/2011 | Chatterjee et al. |
| 8,010,829 B1 | 8/2011 | Chatterjee et al. |
| 8,020,047 B2 | 9/2011 | Courtney |
| 8,046,548 B1 | 10/2011 | Chatterjee et al. |
| 8,051,361 B2 | 11/2011 | Sim-Tang et al. |
| 8,051,362 B2 | 11/2011 | Li et al. |
| 8,082,393 B2 | 12/2011 | Galloway et al. |
| 8,086,634 B2 | 12/2011 | Mimatsu |
| 8,086,911 B1 | 12/2011 | Taylor |
| 8,108,502 B2 | 1/2012 | Tabbara et al. |
| 8,117,388 B2 | 2/2012 | Jernigan, IV |
| 8,145,838 B1 | 3/2012 | Miller et al. |
| 8,145,840 B2 | 3/2012 | Koul et al. |
| 8,176,360 B2 | 5/2012 | Frost et al. |
| 8,244,999 B1 | 8/2012 | Chatterjee et al. |
| 8,305,811 B2 | 11/2012 | Jeon |
| 8,315,999 B2 | 11/2012 | Chatley et al. |
| 8,327,080 B1 | 12/2012 | Der |
| 8,402,152 B2 | 3/2013 | Duran |
| 8,412,880 B2 | 4/2013 | Leibowitz et al. |
| 8,473,778 B2 | 6/2013 | Simitci |
| 8,479,037 B1 | 7/2013 | Chatterjee et al. |
| 8,498,967 B1 | 7/2013 | Chatterjee et al. |
| 8,522,073 B2 | 8/2013 | Cohen |
| 8,533,527 B2 | 9/2013 | Daikokuya et al. |
| 8,595,455 B2 | 11/2013 | Chatterjee et al. |
| 8,615,599 B1 | 12/2013 | Takefman et al. |
| 8,627,136 B2 | 1/2014 | Shankar et al. |
| 8,627,138 B1 | 1/2014 | Clark |
| 8,660,131 B2 | 2/2014 | Vermunt et al. |
| 8,700,875 B1 | 4/2014 | Barron et al. |
| 8,713,405 B2 | 4/2014 | Healey et al. |
| 8,762,793 B2 | 6/2014 | Grube et al. |
| 8,775,858 B2 | 7/2014 | Gower et al. |
| 8,775,868 B2 | 7/2014 | Colgrove et al. |
| 8,788,913 B1 | 7/2014 | Xin et al. |
| 8,799,746 B2 | 8/2014 | Baker et al. |
| 8,819,383 B1 | 8/2014 | Jobanputra et al. |
| 8,824,261 B1 | 9/2014 | Miller et al. |
| 8,843,700 B1 | 9/2014 | Salessi et al. |
| 8,850,108 B1 | 9/2014 | Hayes et al. |
| 8,850,288 B1 | 9/2014 | Lazier et al. |
| 8,856,593 B2 | 10/2014 | Eckhardt et al. |
| 8,856,619 B1 | 10/2014 | Cypher |
| 8,862,847 B2 | 10/2014 | Feng et al. |
| 8,868,825 B1 | 10/2014 | Hayes |
| 8,874,836 B1 | 10/2014 | Hayes |
| 8,898,383 B2 | 11/2014 | Yamamoto et al. |
| 8,898,388 B1 | 11/2014 | Kimmel |
| 8,918,478 B2 | 12/2014 | Ozzie et al. |
| 8,929,066 B2 | 1/2015 | Herman |
| 9,021,053 B2 | 4/2015 | Bernbo et al. |
| 9,025,393 B2 | 5/2015 | Wu |
| 9,053,808 B2 | 6/2015 | Sprouse |
| 9,058,155 B2 | 6/2015 | Cepulis et al. |
| 9,116,819 B2 | 8/2015 | Cope et al. |
| 9,117,536 B2 | 8/2015 | Yoon |
| 9,201,733 B2 | 12/2015 | Verma |
| 9,207,876 B2 | 12/2015 | Shu et al. |
| 9,384,082 B1 | 7/2016 | Lee et al. |
| 9,405,478 B2 | 8/2016 | Koseki et al. |
| 9,411,976 B2 * | 8/2016 | Irvine ................. G06F 21/6218 |
| 9,432,541 B2 | 8/2016 | Ishida |
| 9,471,259 B2 * | 10/2016 | Goel .................... G06F 3/0689 |
| 9,477,632 B2 | 10/2016 | Du |
| 2003/0105984 A1 | 6/2003 | Masuyama et al. |
| 2004/0161086 A1 | 8/2004 | Buntin et al. |
| 2005/0001652 A1 | 1/2005 | Malik et al. |
| 2005/0076228 A1 | 4/2005 | Davis et al. |
| 2005/0283649 A1 | 12/2005 | Turner et al. |
| 2006/0114930 A1 | 6/2006 | Lucas et al. |
| 2006/0174157 A1 | 8/2006 | Barrall et al. |
| 2007/0079068 A1 | 4/2007 | Draggon |
| 2007/0214194 A1 | 9/2007 | Reuter |
| 2007/0214314 A1 | 9/2007 | Reuter |
| 2007/0234016 A1 | 10/2007 | Davis et al. |
| 2007/0268905 A1 | 11/2007 | Baker et al. |
| 2008/0080709 A1 | 4/2008 | Michtchenko et al. |
| 2008/0107274 A1 | 5/2008 | Worthy |
| 2008/0155191 A1 | 6/2008 | Anderson et al. |
| 2008/0295118 A1 | 11/2008 | Liao |
| 2009/0216920 A1 | 8/2009 | Lauterbach et al. |
| 2010/0042636 A1 | 2/2010 | Lu |
| 2010/0115070 A1 | 5/2010 | Missimilly |
| 2010/0169707 A1 | 7/2010 | Mathew et al. |
| 2010/0174576 A1 | 7/2010 | Naylor |
| 2010/0268908 A1 | 10/2010 | Ouyang et al. |
| 2011/0302369 A1 | 12/2011 | Goto et al. |
| 2012/0198152 A1 | 8/2012 | Terry et al. |
| 2012/0198261 A1 | 8/2012 | Brown et al. |
| 2012/0209943 A1 | 8/2012 | Jung |

(56) References Cited

U.S. PATENT DOCUMENTS

| | | |
|---|---|---|
| 2012/0226934 A1 | 9/2012 | Rao |
| 2012/0311557 A1 | 12/2012 | Resch |
| 2013/0022201 A1 | 1/2013 | Glew et al. |
| 2013/0036314 A1 | 2/2013 | Glew et al. |
| 2013/0060884 A1 | 3/2013 | Bernbo et al. |
| 2013/0067188 A1 | 3/2013 | Mehra et al. |
| 2013/0073894 A1 | 3/2013 | Xavier et al. |
| 2013/0124776 A1 | 5/2013 | Hallak et al. |
| 2013/0151653 A1 | 6/2013 | Sawicki et al. |
| 2013/0151771 A1 | 6/2013 | Tsukahara et al. |
| 2013/0238554 A1 | 9/2013 | Yucel et al. |
| 2013/0339314 A1 | 12/2013 | Carpentier et al. |
| 2013/0339818 A1 | 12/2013 | Baker et al. |
| 2014/0040702 A1 | 2/2014 | He et al. |
| 2014/0047263 A1 | 2/2014 | Coatney et al. |
| 2014/0063721 A1 | 3/2014 | Herman et al. |
| 2014/0064048 A1 | 3/2014 | Cohen et al. |
| 2014/0068224 A1 | 3/2014 | Fan et al. |
| 2014/0136880 A1 | 5/2014 | Shankar et al. |
| 2014/0279936 A1 | 9/2014 | Bernbo et al. |
| 2014/0380125 A1 | 12/2014 | Calder et al. |
| 2014/0380126 A1 | 12/2014 | Yekhanin et al. |
| 2015/0089283 A1 | 3/2015 | Kermarrec et al. |
| 2015/0134824 A1 | 5/2015 | Mickens et al. |
| 2015/0153800 A1 | 6/2015 | Lucas et al. |
| 2015/0280959 A1 | 10/2015 | Vincent |

OTHER PUBLICATIONS

Hwang, Kai, Kin, Hai, Ho, Roy: RAID-x: A Distributed Disk Array for I/O-Centric Cluster Computing; 2000.

International Search Report and the Written Opinion of the International Searching Authority, PCT/US2015/018169, mailed May 15, 2015.

International Search Report and the Written Opinion of the International Searching Authority, PCT/US2015/034302, mailed Sep. Sep. 11, 2015.

Schmid, Patrick: "RAID Scaling Charts, Part 3:4-128 kB Stripes Compared", Tom's Hardware, Nov. 27, 2007 (http://www.tomshardware.com/reviews/RAID-SCALING-CHARTS.1735-4.html), See pp. 1-2.

International Search Report, PCT/US2015/034291, mailed Sep. 30, 2015.

International Search Report, PCT/US2015/044370, mailed Dec. 15, 2015.

International Search Report, PCT/US2016/014604, mailed May 19, 2016.

\* cited by examiner

STORAGE CLUSTER

BACKGROUND

Solid-state memory, such as flash, is currently in use in solid-state drives (SSD) to augment or replace conventional hard disk drives (HDD), writable CD (compact disk) or writable DVD (digital versatile disk) drives, collectively known as spinning media, and tape drives, for storage of large amounts of data. Flash and other solid-state memories have characteristics that differ from spinning media. Yet, many solid-state drives are designed to conform to hard disk drive standards for compatibility reasons, which makes it difficult to provide enhanced features or take advantage of unique aspects of flash and other solid-state memory.

It is within this context that the embodiments arise.

SUMMARY

In some embodiments, a method for managing processing power in a storage system is provided. The method includes providing a plurality of blades, each of a first subset of blades having a storage node and storage memory for storing user data, and each of a second, differing subset of blades having a compute node (which may be referred to as a compute-only node) that may have memory for computing operations. The method includes distributing authorities across the plurality of blades, to a plurality of nodes including at least one compute-only node, wherein each authority has ownership of a range of user data.

In some embodiments, a tangible, non-transitory, computer-readable media having instructions thereupon which, when executed by a processor, cause the processor to perform a method is provided. The method includes providing a plurality of blades, each of a first subset having a storage node and storage memory, and each of a second, differing subset having a compute-only node. The method includes distributing authorities across the plurality of blades, to a plurality of nodes including at least one compute-only node, wherein each authority has ownership of a range of user data.

In some embodiments, a storage system is provided. The system includes a plurality of blades, each of a first subset having a storage node and storage memory, and each of a second, differing subset having a compute-only node. The system includes the plurality of blades forming the storage system, wherein authorities are distributed across the plurality of blades, to a plurality of nodes including at least one compute-only node, and wherein each authority has ownership of a range of user data.

Other aspects and advantages of the embodiments will become apparent from the following detailed description taken in conjunction with the accompanying drawings which illustrate, by way of example, the principles of the described embodiments.

BRIEF DESCRIPTION OF THE DRAWINGS

The described embodiments and the advantages thereof may best be understood by reference to the following description taken in conjunction with the accompanying drawings. These drawings in no way limit any changes in form and detail that may be made to the described embodiments by one skilled in the art without departing from the spirit and scope of the described embodiments.

DETAILED DESCRIPTION

Figure 1:
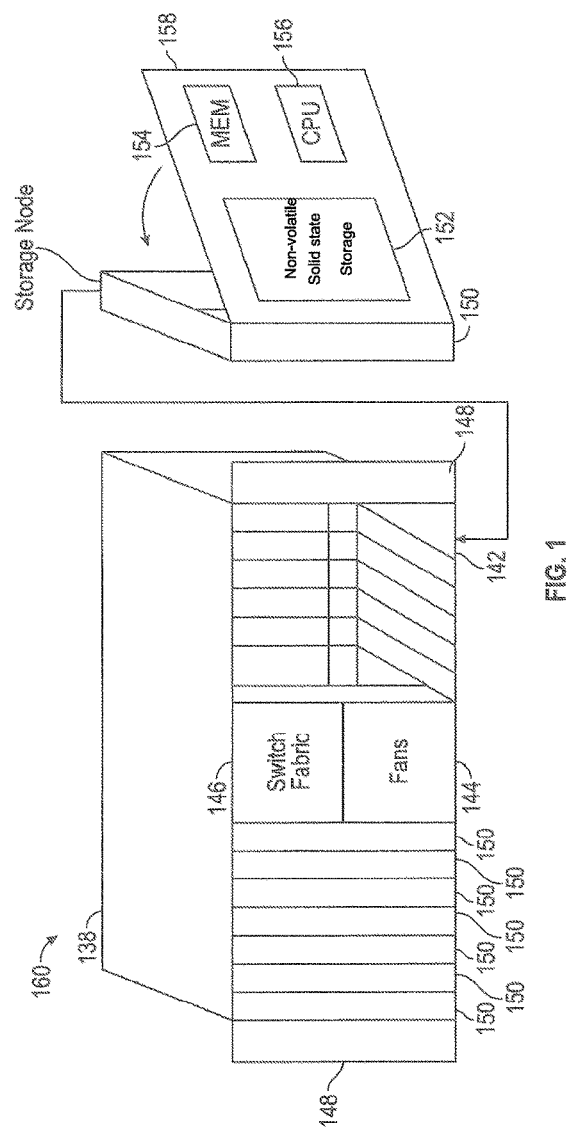
FIG. 1 is a perspective view of a storage cluster with multiple storage nodes and internal storage coupled to each storage node to provide network attached storage, in accordance with some embodiments.

The embodiments below describe a storage cluster that stores user data, such as user data originating from one or more user or client systems or other sources external to the storage cluster. The storage cluster distributes user data across storage nodes housed within a chassis, using erasure coding and redundant copies of metadata. Erasure coding refers to a method of data protection or reconstruction in which data is stored across a set of different locations, such as disks, storage nodes or geographic locations. Flash memory is one type of solid-state memory that may be integrated with the embodiments, although the embodiments may be extended to other types of solid-state memory or other storage medium, including non-solid state memory. Control of storage locations and workloads are distributed across the storage locations in a clustered peer-to-peer system. Tasks such as mediating communications between the various storage nodes, detecting when a storage node has become unavailable, and balancing I/Os (inputs and outputs) across the various storage nodes, are all handled on a distributed basis. Data is laid out or distributed across multiple storage nodes in data fragments or stripes that support data recovery in some embodiments. Ownership of data can be reassigned within a cluster, independent of input and output patterns. This architecture described in more detail below allows a storage node in the cluster to fail, with the system remaining operational, since the data can be reconstructed from other storage nodes and thus remain available for input and output operations. In various embodiments, a storage node may be referred to as a cluster node, a blade, or a server. Some embodiments of the storage cluster have hybrid blades, which have storage memory, and compute blades, which do not. Authorities, each of which has ownership of a range of user data, are distributed across hybrid blades, or hybrid blades and compute blades, so as to balance processing power available to each authority or distribute processing power in accordance with policies, agreements or multi-tenant service.

The storage cluster is contained within a chassis, i.e., an enclosure housing one or more storage nodes. A mechanism to provide power to each storage node, such as a power distribution bus, and a communication mechanism, such as a communication bus that enables communication between the storage nodes are included within the chassis. The storage cluster can run as an independent system in one location according to some embodiments. In one embodiment, a chassis contains at least two instances of both the power distribution and the communication bus which may be enabled or disabled independently. The internal communication bus may be an Ethernet bus, however, other technologies such as Peripheral Component Interconnect (PCI) Express, InfiniBand, and others, are equally suitable. The chassis provides a port for an external communication bus for enabling communication between multiple chassis, directly or through a switch, and with client systems. The external communication may use a technology such as Ethernet, InfiniBand, Fibre Channel, etc. In some embodiments, the external communication bus uses different communication bus technologies for inter-chassis and client communication. If a switch is deployed within or between chassis, the switch may act as a translation between multiple protocols or technologies. When multiple chassis are connected to define a storage cluster, the storage cluster may be accessed by a client using either proprietary interfaces or standard interfaces such as network file system (NFS), common internet file system (CIFS), small computer system interface (SCSI) or hypertext transfer protocol (HTTP). Translation from the client protocol may occur at the switch, chassis external communication bus or within each storage node.

Each storage node may be one or more storage servers and each storage server is connected to one or more non-volatile solid state memory units, which may be referred to as storage units. One embodiment includes a single storage server in each storage node and between one to eight non-volatile solid state memory units, however this one example is not meant to be limiting. The storage server may include a processor, dynamic random access memory (DRAM) and interfaces for the internal communication bus and power distribution for each of the power buses. Inside the storage node, the interfaces and storage unit share a communication bus, e.g., PCI Express, in some embodiments. The non-volatile solid state memory units may directly access the internal communication bus interface through a storage node communication bus, or request the storage node to access the bus interface. The non-volatile solid state memory unit contains an embedded central processing unit (CPU), solid state storage controller, and a quantity of solid state mass storage, e.g., between 2-32 terabytes (TB) in some embodiments. An embedded volatile storage medium, such as DRAM, and an energy reserve apparatus are included in the non-volatile solid state memory unit. In some embodiments, the energy reserve apparatus is a capacitor, super-capacitor, or battery that enables transferring a subset of DRAM contents to a stable storage medium in the case of power loss. In some embodiments, the non-volatile solid state memory unit is constructed with a storage class memory, such as phase change or magnetoresistive random access memory (MRAM) that substitutes for DRAM and enables a reduced power hold-up apparatus.

One of many features of the storage nodes and non-volatile solid state storage is the ability to proactively rebuild data in a storage cluster. The storage nodes and non-volatile solid state storage can determine when a storage node or non-volatile solid state storage in the storage cluster is unreachable, independent of whether there is an attempt to read data involving that storage node or non-volatile solid state storage. The storage nodes and non-volatile solid state storage then cooperate to recover and rebuild the data in at least partially new locations. This constitutes a proactive rebuild, in that the system rebuilds data without waiting until the data is needed for a read access initiated from a client system employing the storage cluster. These and further details of the storage memory and operation thereof are discussed below.

FIG. 1 is a perspective view of a storage cluster 160, with multiple storage nodes 150 and internal solid-state memory coupled to each storage node to provide network attached storage or storage area network, in accordance with some embodiments. A network attached storage, storage area network, or a storage cluster, or other storage memory, could include one or more storage clusters 160, each having one or more storage nodes 150, in a flexible and reconfigurable arrangement of both the physical components and the amount of storage memory provided thereby. The storage cluster 160 is designed to fit in a rack, and one or more racks can be set up and populated as desired for the storage memory. The storage cluster 160 has a chassis 138 having multiple slots 142. It should be appreciated that chassis 138 may be referred to as a housing, enclosure, or rack unit. In one embodiment, the chassis 138 has fourteen slots 142, although other numbers of slots are readily devised. For example, some embodiments have four slots, eight slots, sixteen slots, thirty-two slots, or other suitable number of slots. Each slot 142 can accommodate one storage node 150 in some embodiments. Chassis 138 includes flaps 148 that can be utilized to mount the chassis 138 on a rack. Fans 144 provide air circulation for cooling of the storage nodes 150 and components thereof, although other cooling components could be used, or an embodiment could be devised without cooling components. A switch fabric 146 couples storage nodes 150 within chassis 138 together and to a network for communication to the memory. In an embodiment depicted in FIG. 1, the slots 142 to the left of the switch fabric 146 and fans 144 are shown occupied by storage nodes 150, while the slots 142 to the right of the switch fabric 146 and fans 144 are empty and available for insertion of storage node 150 for illustrative purposes. This configuration is one example, and one or more storage nodes 150 could occupy the slots 142 in various further arrangements. The storage node arrangements need not be sequential or adjacent in some embodiments. Storage nodes 150 are hot pluggable, meaning that a storage node 150 can be inserted into a slot 142 in the chassis 138, or removed from a slot 142, without stopping or powering down the system. Upon insertion or removal of storage node 150 from slot 142, the system automatically reconfigures in order to recognize and adapt to the change. Reconfiguration, in some embodiments, includes restoring redundancy and/or rebalancing data or load.

Each storage node 150 can have multiple components. In the embodiment shown here, the storage node 150 includes a printed circuit board 158 populated by a CPU 156, i.e., processor, a memory 154 coupled to the CPU 156, and a non-volatile solid state storage 152 coupled to the CPU 156, although other mountings and/or components could be used in further embodiments. The memory 154 has instructions which are executed by the CPU 156 and/or data operated on by the CPU 156. As further explained below, the non-volatile solid state storage 152 includes flash or, in further embodiments, other types of solid-state memory.

Figure 2:
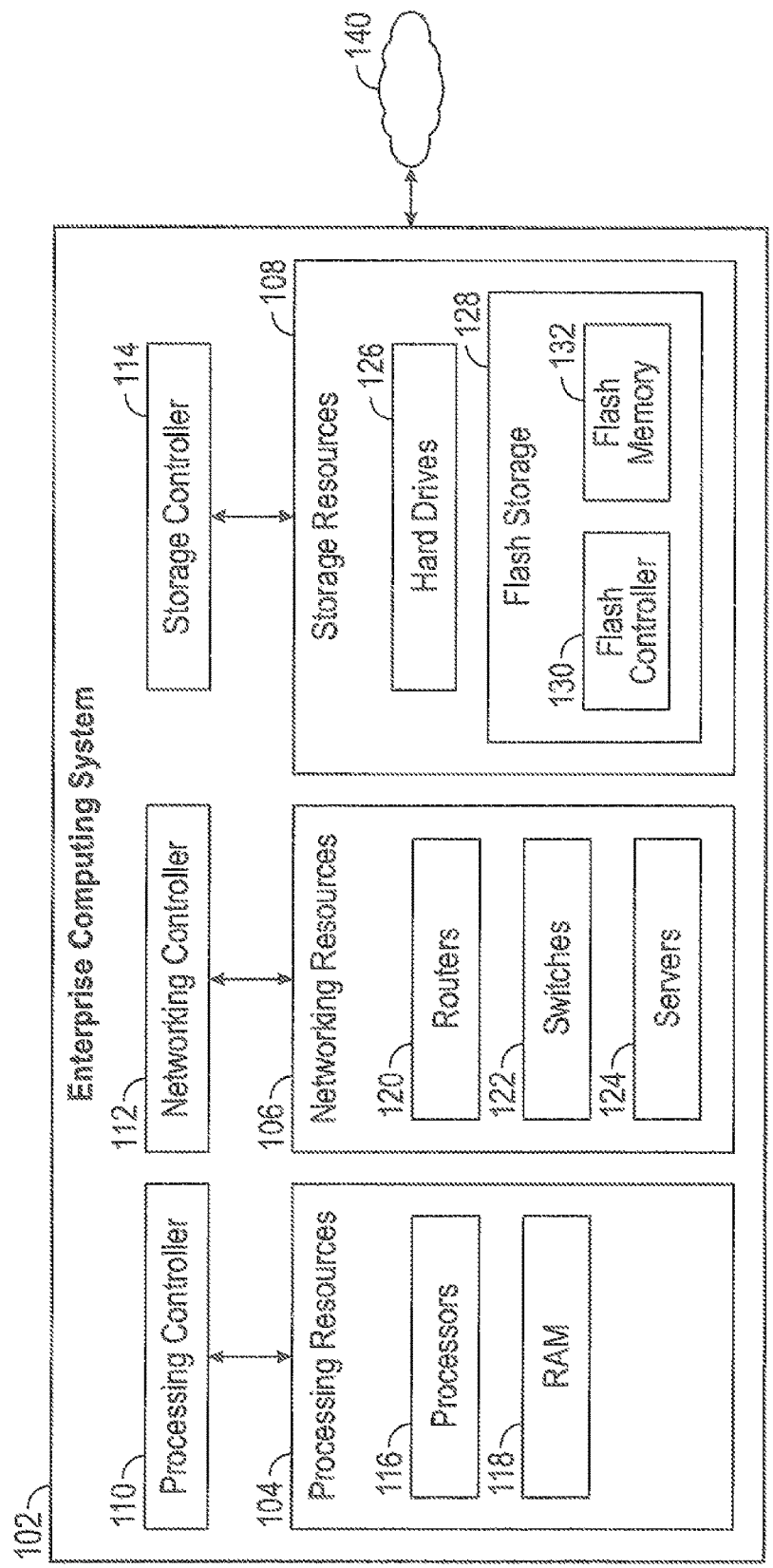
FIG. 2 is a system diagram of an enterprise computing system, which can use one or more of the storage clusters of FIG. 1 as a storage resource in some embodiments.

FIG. 2 is a system diagram of an enterprise computing system 102, which can use one or more of the storage nodes, storage clusters and/or non-volatile solid state storage of FIG. 1 as a storage resource 108. For example, flash storage 128 of FIG. 2 may integrate the storage nodes, storage clusters and/or non-volatile solid state storage of FIG. 1 in some embodiments. The enterprise computing system 102 has processing resources 104, networking resources 106 and storage resources 108, including flash storage 128. A flash controller 130 and flash memory 132 are included in the flash storage 128. In various embodiments, the flash storage 128 could include one or more storage nodes or storage clusters, with the flash controller 130 including the CPUs, and the flash memory 132 including the non-volatile solid state storage of the storage nodes. In some embodiments flash memory 132 may include different types of flash memory or the same type of flash memory. The enterprise computing system 102 illustrates an environment suitable for deployment of the flash storage 128, although the flash storage 128 could be used in other computing systems or devices, larger or smaller, or in variations of the enterprise computing system 102, with fewer or additional resources. The enterprise computing system 102 can be coupled to a network 140, such as the Internet, in order to provide or make use of services. For example, the enterprise computing system 102 could provide cloud services, physical computing resources, or virtual computing services.

In the enterprise computing system 102, various resources are arranged and managed by various controllers. A processing controller 110 manages the processing resources 104, which include processors 116 and random-access memory (RAM) 118. Networking controller 112 manages the networking resources 106, which include routers 120, switches 122, and servers 124. A storage controller 114 manages storage resources 108, which include hard drives 126 and flash storage 128. Other types of processing resources, networking resources, and storage resources could be included with the embodiments. In some embodiments, the flash storage 128 completely replaces the hard drives 126. The enterprise computing system 102 can provide or allocate the various resources as physical computing resources, or in variations, as virtual computing resources supported by physical computing resources. For example, the various resources could be implemented using one or more servers executing software. Files or data objects, or other forms of data, are stored in the storage resources 108.

In various embodiments, an enterprise computing system 102 could include multiple racks populated by storage clusters, and these could be located in a single physical location such as in a cluster or a server farm. In other embodiments the multiple racks could be located at multiple physical locations such as in various cities, states or countries, connected by a network. Each of the racks, each of the storage clusters, each of the storage nodes, and each of the non-volatile solid state storage could be individually configured with a respective amount of storage space, which is then reconfigurable independently of the others. Storage capacity can thus be flexibly added, upgraded, subtracted, recovered and/or reconfigured at each of the non-volatile solid state storages. As mentioned previously, each storage node could implement one or more servers in some embodiments.

Figure 3:
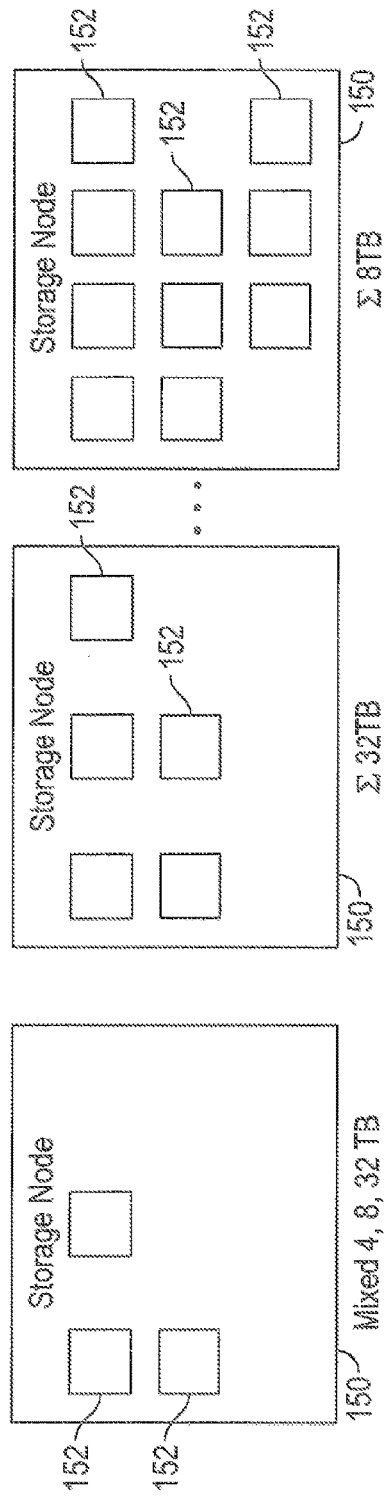
FIG. 3 is a block diagram showing multiple storage nodes and non-volatile solid state storage with differing capacities, suitable for use in the storage cluster of FIG. 1 in accordance with some embodiments.

FIG. 3 is a block diagram showing multiple storage nodes 150 and non-volatile solid state storage 152 with differing capacities, suitable for use in the chassis of FIG. 1. Each storage node 150 can have one or more units of non-volatile solid state storage 152. Each non-volatile solid state storage 152 may include differing capacity from other non-volatile solid state storage 152 on a storage node 150 or in other storage nodes 150 in some embodiments. Alternatively, all of the non-volatile solid state storages 152 on a storage node or on multiple storage nodes can have the same capacity or combinations of the same and/or differing capacities. This flexibility is illustrated in FIG. 3, which shows an example of one storage node 150 having mixed non-volatile solid state storage 152 of four, eight and thirty-two TB capacity, another storage node 150 having non-volatile solid state storage 152 each of thirty-two TB capacity, and still another storage node having non-volatile solid state storage 152 each of eight TB capacity. Various further combinations and capacities are readily devised in accordance with the teachings herein. In the context of clustering, e.g., clustering storage to form a storage cluster, a storage node can be or include a non-volatile solid state storage 152. Non-volatile solid state storage 152 is a convenient clustering point as the non-volatile solid state storage 152 may include a nonvolatile random access memory (NVRAM) component, as will be further described below.

Referring to FIGS. 1 and 3, storage cluster 160 is scalable, meaning that storage capacity with non-uniform storage sizes is readily added, as described above. One or more storage nodes 150 can be plugged into or removed from each chassis and the storage cluster self-configures in some embodiments. Plug-in storage nodes 150, whether installed in a chassis as delivered or later added, can have different sizes. For example, in one embodiment a storage node 150 can have any multiple of 4 TB, e.g., 8 TB, 12 TB, 16 TB, 32 TB, etc. In further embodiments, a storage node 150 could have any multiple of other storage amounts or capacities. Storage capacity of each storage node 150 is broadcast, and influences decisions of how to stripe the data. For maximum storage efficiency, an embodiment can self-configure as wide as possible in the stripe, subject to a predetermined requirement of continued operation with loss of up to one, or up to two, non-volatile solid state storage units 152 or storage nodes 150 within the chassis.

Figure 4:
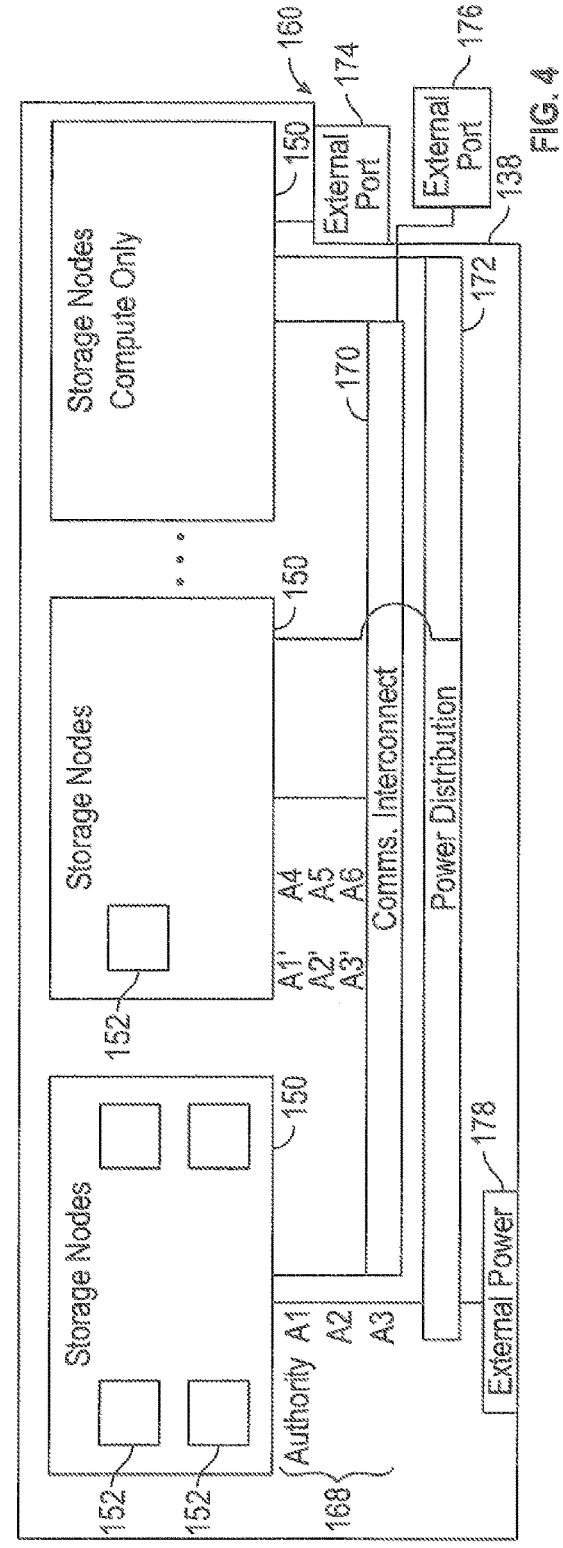
FIG. 4 is a block diagram showing an interconnect switch coupling multiple storage nodes in accordance with some embodiments.

FIG. 4 is a block diagram showing a communications interconnect 170 and power distribution bus 172 coupling multiple storage nodes 150. Referring back to FIG. 1, the communications interconnect 170 can be included in or implemented with the switch fabric 146 in some embodiments. Where multiple storage clusters 160 occupy a rack, the communications interconnect 170 can be included in or implemented with a top of rack switch, in some embodiments. As illustrated in FIG. 4, storage cluster 160 is enclosed within a single chassis 138. External port 176 is coupled to storage nodes 150 through communications interconnect 170, while external port 174 is coupled directly to a storage node. External power port 178 is coupled to power distribution bus 172. Storage nodes 150 may include varying amounts and differing capacities of non-volatile solid state storage 152 as described with reference to FIG. 3. In addition, one or more storage nodes 150 may be a compute only storage node as illustrated in FIG. 4. Authorities 168 are implemented on the non-volatile solid state storages 152, for example as lists or other data structures stored in memory. In some embodiments the authorities are stored within the non-volatile solid state storage 152 and supported by software executing on a controller or other processor of the non-volatile solid state storage 152. In a further embodiment, authorities 168 are implemented on the storage nodes 150, for example as lists or other data structures stored in the memory 154 and supported by software executing on the CPU 156 of the storage node 150. Authorities 168 control how and where data is stored in the non-volatile solid state storages 152 in some embodiments. This control assists in determining which type of erasure coding scheme is applied to the data, and which storage nodes 150 have which portions of the data. Each authority 168 may be assigned to a non-volatile solid state storage 152. Each authority may control a range of inode numbers, segment numbers, or other data identifiers which are assigned to data by a file system, by the storage nodes 150, or by the non-volatile solid state storage 152, in various embodiments.

Every piece of data, and every piece of metadata, has redundancy in the system in some embodiments. In addition, every piece of data and every piece of metadata has an owner, which may be referred to as an authority. If that authority is unreachable, for example through failure of a storage node, there is a plan of succession for how to find that data or that metadata. In various embodiments, there are redundant copies of authorities 168. Authorities 168 have a relationship to storage nodes 150 and non-volatile solid state storage 152 in some embodiments. Each authority 168, covering a range of data segment numbers or other identifiers of the data, may be assigned to a specific non-volatile solid state storage 152. In some embodiments the authorities 168 for all of such ranges are distributed over the non-volatile solid state storages 152 of a storage cluster. Each storage node 150 has a network port that provides access to the non-volatile solid state storage(s) 152 of that storage node 150. Data can be stored in a segment, which is associated with a segment number and that segment number is an indirection for a configuration of a RAID (redundant array of independent disks) stripe in some embodiments. The assignment and use of the authorities 168 thus establishes an indirection to data. Indirection may be referred to as the ability to reference data indirectly, in this case via an authority 168, in accordance with some embodiments. A segment identifies a set of non-volatile solid state storage 152 and a local identifier into the set of non-volatile solid state storage 152 that may contain data. In some embodiments, the local identifier is an offset into the device and may be reused sequentially by multiple segments. In other embodiments the local identifier is unique for a specific segment and never reused. The offsets in the non-volatile solid state storage 152 are applied to locating data for writing to or reading from the non-volatile solid state storage 152 (in the form of a RAID stripe). Data is striped across multiple units of non-volatile solid state storage 152, which may include or be different from the non-volatile solid state storage 152 having the authority 168 for a particular data segment.

If there is a change in where a particular segment of data is located, e.g., during a data move or a data reconstruction, the authority 168 for that data segment should be consulted, at that non-volatile solid state storage 152 or storage node 150 having that authority 168. In order to locate a particular piece of data, embodiments calculate a hash value for a data segment or apply an inode number or a data segment number. The output of this operation points to a non-volatile solid state storage 152 having the authority 168 for that particular piece of data. In some embodiments there are two stages to this operation. The first stage maps an entity identifier (ID), e.g., a segment number, inode number, or directory number to an authority identifier. This mapping may include a calculation such as a hash or a bit mask. The second stage is mapping the authority identifier to a particular non-volatile solid state storage 152, which may be done through an explicit mapping. The operation is repeatable, so that when the calculation is performed, the result of the calculation repeatably and reliably points to a particular non-volatile solid state storage 152 having that authority 168. The operation may include the set of reachable storage nodes as input. If the set of reachable non-volatile solid state storage units changes the optimal set changes. In some embodiments, the persisted value is the current assignment (which is always true) and the calculated value is the target assignment the cluster will attempt to reconfigure towards. This calculation may be used to determine the optimal non-volatile solid state storage 152 for an authority in the presence of a set of non-volatile solid state storage 152 that are reachable and constitute the same cluster. The calculation also determines an ordered set of peer non-volatile solid state storage 152 that will also record the authority to non-volatile solid state storage mapping so that the authority may be determined even if the assigned non-volatile solid state storage is unreachable. A duplicate or substitute authority 168 may be consulted if a specific authority 168 is unavailable in some embodiments.

With reference to FIGS. 1-4, two of the many tasks of the CPU 156 on a storage node 150 are to break up write data, and reassemble read data. When the system has determined that data is to be written, the authority 168 for that data is located as above. When the segment ID for data is already determined the request to write is forwarded to the non-volatile solid state storage 152 currently determined to be the host of the authority 168 determined from the segment. The host CPU 156 of the storage node 150, on which the non-volatile solid state storage 152 and corresponding authority 168 reside, then breaks up or shards the data and transmits the data out to various non-volatile solid state storage 152. The transmitted data is written as a data stripe in accordance with an erasure coding scheme. In some embodiments, data is requested to be pulled, and in other embodiments, data is pushed. In reverse, when data is read, the authority 168 for the segment ID containing the data is located as described above. The host CPU 156 of the storage node 150 on which the non-volatile solid state storage 152 and corresponding authority 168 reside requests the data from the non-volatile solid state storage and corresponding storage nodes pointed to by the authority. In some embodiments the data is read from flash storage as a data stripe. The host CPU 156 of storage node 150 then reassembles the read data, correcting any errors (if present) according to the appropriate erasure coding scheme, and forwards the reassembled data to the network. In further embodiments, some or all of these tasks can be handled in the non-volatile solid state storage 152. In some embodiments, the segment host requests the data be sent to storage node 150 by requesting pages from storage and then sending the data to the storage node making the original request.

In some systems, for example in UNIX-style file systems, data is handled with an index node or inode, which specifies a data structure that represents an object in a file system. The object could be a file or a directory, for example. Metadata may accompany the object, as attributes such as permission data and a creation timestamp, among other attributes. A segment number could be assigned to all or a portion of such an object in a file system. In other systems, data segments are handled with a segment number assigned elsewhere. For purposes of discussion, the unit of distribution is an entity, and an entity can be a file, a directory or a segment. That is, entities are units of data or metadata stored by a storage system. Entities are grouped into sets called authorities. Each authority has an authority owner, which is a storage node that has the exclusive right to update the entities in the authority. In other words, a storage node contains the authority, and that the authority, in turn, contains entities.

A segment is a logical container of data in accordance with some embodiments. A segment is an address space between medium address space and physical flash locations, i.e., the data segment number, are in this address space. Segments may also contain meta-data, which enable data redundancy to be restored (rewritten to different flash locations or devices) without the involvement of higher level software. In one embodiment, an internal format of a segment contains client data and medium mappings to determine the position of that data. Each data segment is protected, e.g., from memory and other failures, by breaking the segment into a number of data and parity shards, where applicable. The data and parity shards are distributed, i.e., striped, across non-volatile solid state storage 152 coupled to the host CPUs 156 (See FIG. 5) in accordance with an erasure coding scheme. Usage of the term segments refers to the container and its place in the address space of segments in some embodiments. Usage of the term stripe refers to the same set of shards as a segment and includes how the shards are distributed along with redundancy or parity information in accordance with some embodiments.

A series of address-space transformations takes place across an entire storage system. At the top is the directory entries (file names) which link to an inode. Inodes point into medium address space, where data is logically stored. Medium addresses may be mapped through a series of indirect mediums to spread the load of large files, or implement data services like deduplication or snapshots. Medium addresses may be mapped through a series of indirect mediums to spread the load of large files, or implement data services like deduplication or snapshots. Segment addresses are then translated into physical flash locations. Physical flash locations have an address range bounded by the amount of flash in the system in accordance with some embodiments. Medium addresses and segment addresses are logical containers, and in some embodiments use a 128 bit or larger identifier so as to be practically infinite, with a likelihood of reuse calculated as longer than the expected life of the system. Addresses from logical containers are allocated in a hierarchical fashion in some embodiments. Initially, each non-volatile solid state storage 152 may be assigned a range of address space. Within this assigned range, the non-volatile solid state storage 152 is able to allocate addresses without synchronization with other non-volatile solid state storage 152.

Data and metadata is stored by a set of underlying storage layouts that are optimized for varying workload patterns and storage devices. These layouts incorporate multiple redundancy schemes, compression formats and index algorithms. Some of these layouts store information about authorities and authority masters, while others store file metadata and file data. The redundancy schemes include error correction codes that tolerate corrupted bits within a single storage device (such as a NAND flash chip), erasure codes that tolerate the failure of multiple storage nodes, and replication schemes that tolerate data center or regional failures. In some embodiments, low density parity check (LDPC) code is used within a single storage unit. Reed-Solomon encoding is used within a storage cluster, and mirroring is used within a storage grid in some embodiments. Metadata may be stored using an ordered log structured index (such as a Log Structured Merge Tree), and large data may not be stored in a log structured layout.

In order to maintain consistency across multiple copies of an entity, the storage nodes agree implicitly on two things through calculations: (1) the authority that contains the entity, and (2) the storage node that contains the authority. The assignment of entities to authorities can be done by pseudorandomly assigning entities to authorities, by splitting entities into ranges based upon an externally produced key, or by placing a single entity into each authority. Examples of pseudorandom schemes are linear hashing and the Replication Under Scalable Hashing (RUSH) family of hashes, including Controlled Replication Under Scalable Hashing (CRUSH). In some embodiments, pseudo-random assignment is utilized only for assigning authorities to nodes because the set of nodes can change. The set of authorities cannot change so any subjective function may be applied in these embodiments. Some placement schemes automatically place authorities on storage nodes, while other placement schemes rely on an explicit mapping of authorities to storage nodes. In some embodiments, a pseudorandom scheme is utilized to map from each authority to a set of candidate authority owners. A pseudorandom data distribution function related to CRUSH may assign authorities to storage nodes and create a list of where the authorities are assigned. Each storage node has a copy of the pseudorandom data distribution function, and can arrive at the same calculation for distributing, and later finding or locating an authority. Each of the pseudorandom schemes requires the reachable set of storage nodes as input in some embodiments in order to conclude the same target nodes. Once an entity has been placed in an authority, the entity may be stored on physical devices so that no expected failure will lead to unexpected data loss. In some embodiments, rebalancing algorithms attempt to store the copies of all entities within an authority in the same layout and on the same set of machines.

Examples of expected failures include device failures, stolen machines, datacenter fires, and regional disasters, such as nuclear or geological events. Different failures lead to different levels of acceptable data loss. In some embodiments, a stolen storage node impacts neither the security nor the reliability of the system, while depending on system configuration, a regional event could lead to no loss of data, a few seconds or minutes of lost updates, or even complete data loss.

In the embodiments, the placement of data for storage redundancy is independent of the placement of authorities for data consistency. In some embodiments, storage nodes that contain authorities do not contain any persistent storage. Instead, the storage nodes are connected to non-volatile solid state storage units that do not contain authorities. The communications interconnect between storage nodes and non-volatile solid state storage units consists of multiple communication technologies and has non-uniform performance and fault tolerance characteristics. In some embodiments, as mentioned above, non-volatile solid state storage units are connected to storage nodes via PCI express, storage nodes are connected together within a single chassis using Ethernet backplane, and chassis are connected together to form a storage cluster. Storage clusters are connected to clients using Ethernet or fiber channel in some embodiments. If multiple storage clusters are configured into a storage grid, the multiple storage clusters are connected using the Internet or other long-distance networking links, such as a "metro scale" link or private link that does not traverse the internet.

Authority owners have the exclusive right to modify entities, to migrate entities from one non-volatile solid state storage unit to another non-volatile solid state storage unit, and to add and remove copies of entities. This allows for maintaining the redundancy of the underlying data. When an authority owner fails, is going to be decommissioned, or is overloaded, the authority is transferred to a new storage node. Transient failures make it non-trivial to ensure that all non-faulty machines agree upon the new authority location. The ambiguity that arises due to transient failures can be achieved automatically by a consensus protocol such as Paxos, hot-warm failover schemes, via manual intervention by a remote system administrator, or by a local hardware administrator (such as by physically removing the failed machine from the cluster, or pressing a button on the failed machine). In some embodiments, a consensus protocol is used, and failover is automatic. If too many failures or replication events occur in too short a time period, the system goes into a self-preservation mode and halts replication and data movement activities until an administrator intervenes in accordance with some embodiments.

As authorities are transferred between storage nodes and authority owners update entities in their authorities, the system transfers messages between the storage nodes and non-volatile solid state storage units. With regard to persistent messages, messages that have different purposes are of different types. Depending on the type of the message, the system maintains different ordering and durability guarantees. As the persistent messages are being processed, the messages are temporarily stored in multiple durable and non-durable storage hardware technologies. In some embodiments, messages are stored in RAM, NVRAM and on NAND flash devices, and a variety of protocols are used in order to make efficient use of each storage medium. Latency-sensitive client requests may be persisted in replicated NVRAM, and then later NAND, while background rebalancing operations are persisted directly to NAND.

Persistent messages are persistently stored prior to being transmitted. This allows the system to continue to serve client requests despite failures and component replacement. Although many hardware components contain unique identifiers that are visible to system administrators, manufacturer, hardware supply chain and ongoing monitoring quality control infrastructure, applications running on top of the infrastructure address virtualize addresses. These virtualized addresses do not change over the lifetime of the storage system, regardless of component failures and replacements. This allows each component of the storage system to be replaced over time without reconfiguration or disruptions of client request processing.

In some embodiments, the virtualized addresses are stored with sufficient redundancy. A continuous monitoring system correlates hardware and software status and the hardware identifiers. This allows detection and prediction of failures due to faulty components and manufacturing details. The monitoring system also enables the proactive transfer of authorities and entities away from impacted devices before failure occurs by removing the component from the critical path in some embodiments.

Figure 5:
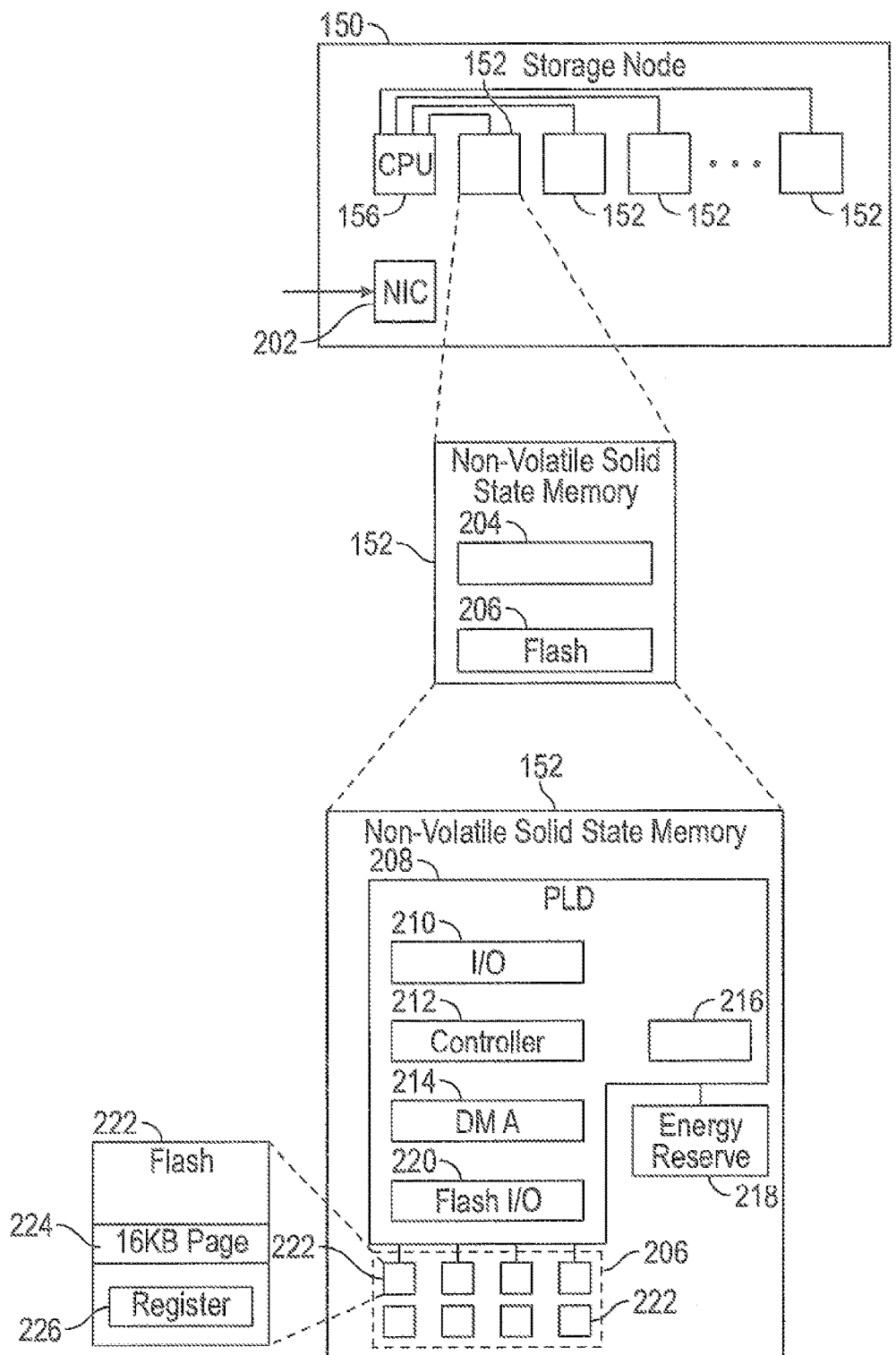
FIG. 5 is a multiple level block diagram, showing contents of a storage node and contents of one of the non-volatile solid state storage units in accordance with some embodiments.

FIG. 5 is a multiple level block diagram, showing contents of a storage node 150 and contents of a non-volatile solid state storage 152 of the storage node 150. Data is communicated to and from the storage node 150 by a network interface controller (NIC) 202 in some embodiments. Each storage node 150 has a CPU 156, and one or more non-volatile solid state storage 152, as discussed above. Moving down one level in FIG. 5, each non-volatile solid state storage 152 has a relatively fast non-volatile solid state memory, such as nonvolatile random access memory (NVRAM) 204, and flash memory 206. In some embodiments, NVRAM 204 may be a component that does not require program/erase cycles (DRAM, MRAM, PCM), and can be a memory that can support being written vastly more often than the memory is read from. Moving down another level in FIG. 5, the NVRAM 204 is implemented in one embodiment as high speed volatile memory, such as dynamic random access memory (DRAM) 216, backed up by energy reserve 218. Energy reserve 218 provides sufficient electrical power to keep the DRAM 216 powered long enough for contents to be transferred to the flash memory 206 in the event of power failure. In some embodiments, energy reserve 218 is a capacitor, super-capacitor, battery, or other device, that supplies a suitable supply of energy sufficient to enable the transfer of the contents of DRAM 216 to a stable storage medium in the case of power loss. The flash memory 206 is implemented as multiple flash dies 222, which may be referred to as packages of flash dies 222 or an array of flash dies 222. It should be appreciated that the flash dies 222 could be packaged in any number of ways, with a single die per package, multiple dies per package (i.e. multichip packages), in hybrid packages, as bare dies on a printed circuit board or other substrate, as encapsulated dies, etc. In the embodiment shown, the non-volatile solid state storage 152 has a controller 212 or other processor, and an input output (I/O) port 210 coupled to the controller 212. I/O port 210 is coupled to the CPU 156 and/or the network interface controller 202 of the flash storage node 150. Flash input output (I/O) port 220 is coupled to the flash dies 222, and a direct memory access unit (DMA) 214 is coupled to the controller 212, the DRAM 216 and the flash dies 222. In the embodiment shown, the I/O port 210, controller 212, DMA unit 214 and flash I/O port 220 are implemented on a programmable logic device (PLD) 208, e.g., a field programmable gate array (FPGA). In this embodiment, each flash die 222 has pages, organized as sixteen kB (kilobyte) pages 224, and a register 226 through which data can be written to or read from the flash die 222. In further embodiments, other types of solid-state memory are used in place of, or in addition to flash memory illustrated within flash die 222.

Storage cluster 160, in various embodiments as disclosed herein, can be contrasted with storage arrays in general. The storage nodes 150 are part of a collection that creates the storage cluster 160. Each storage node 150 owns a slice of data and computing required to provide the data. Multiple storage nodes 150 cooperate to store and retrieve the data. Storage memory or storage devices, as used in storage arrays in general, are less involved with processing and manipulating the data. Storage memory or storage devices in a storage array receive commands to read, write, or erase data. The storage memory or storage devices in a storage array are not aware of a larger system in which they are embedded, or what the data means. Storage memory or storage devices in storage arrays can include various types of storage memory, such as RAM, solid state drives, hard disk drives, etc. The non-volatile solid state storage 152 described herein have multiple interfaces active simultaneously and serving multiple purposes. In some embodiments, some of the functionality of a storage node 150 is shifted into non-volatile solid state storage 152, transforming the non-volatile solid state storage 152 into a combination of non-volatile solid state storage 152 and storage node 150. Placing computing (relative to storage data) into the non-volatile solid state storage 152 places this computing closer to the data itself. The various system embodiments have a hierarchy of storage node layers with different capabilities. By contrast, in a storage array, a controller owns and knows everything about all of the data that the controller manages in a shelf or storage devices. In a storage cluster 160, as described herein, multiple controllers in multiple non-volatile solid state storage units 152 and/or storage nodes 150 cooperate in various ways (e.g., for erasure coding, data sharding, metadata communication and redundancy, storage capacity expansion or contraction, data recovery, and so on).

Figure 6:
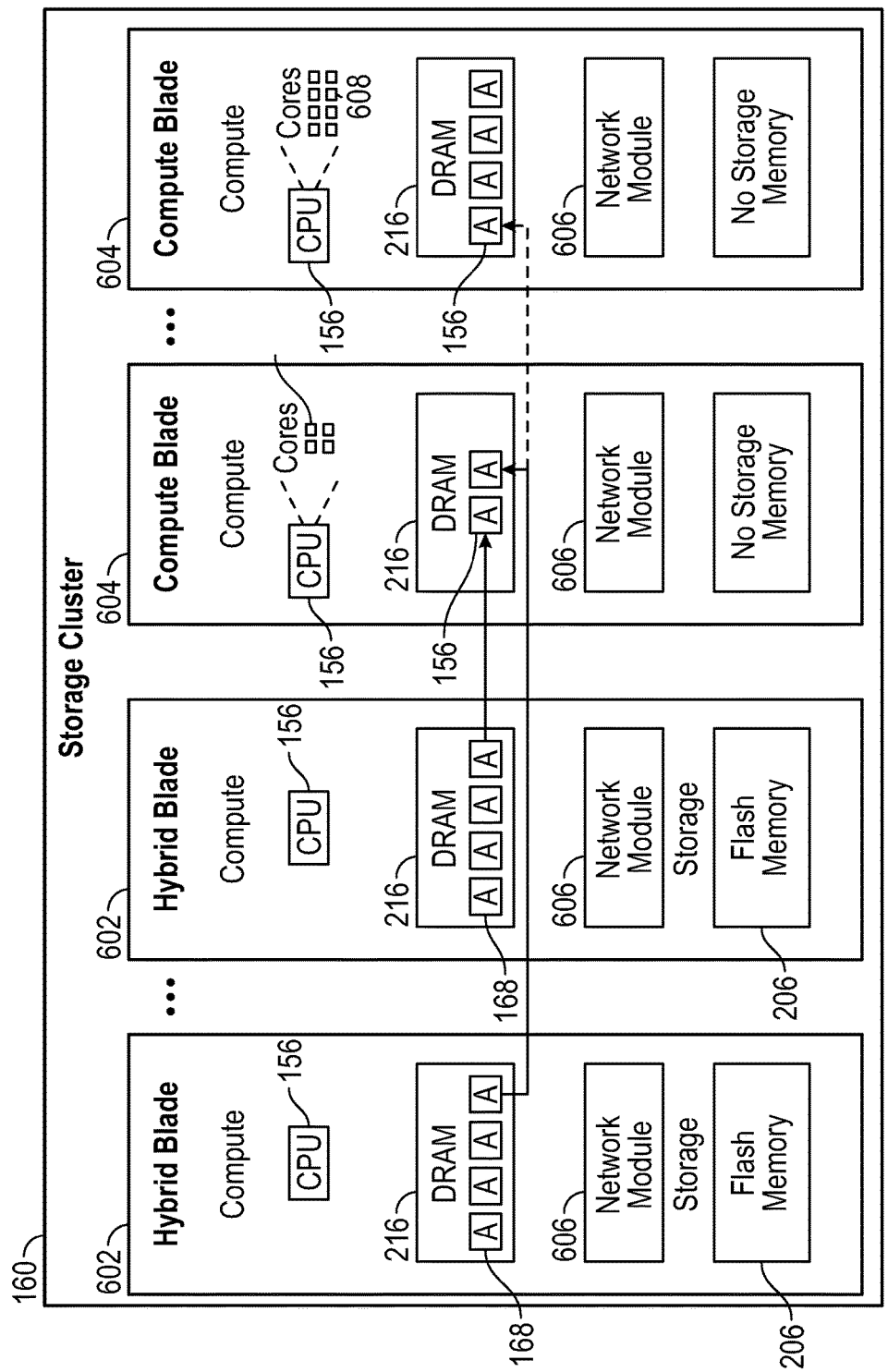
FIG. 6 is a diagram of a storage system that uses an embodiment of the storage cluster of FIGS. 1-5, with data-owning authorities distributed across hybrid blades and one or more compute blades.

FIG. 6 is a diagram of a storage system that uses an embodiment of the storage cluster 160 of FIGS. 1-5, with data-owning authorities 168 distributed across hybrid blades 602 and one or more compute blades 604. Blades are physical constructs, with circuitry, processor(s), and assorted hardware. Each hybrid blade 602 has storage memory for storing user data, which is flash memory 206 in this embodiment but could be other types of storage memory in further embodiments, and processing resources, including the CPU 156 and DRAM 216. Each compute blade 604 has processing resources, including a CPU 156 and DRAM 216, but, unlike a hybrid blades 602, does not have storage memory for storing user data. That is, unlike the hybrid blade 602, the compute blade 604 does not store user data on the compute blade 604 itself. Hybrid blades 602 and compute blades 604 could have other types of memory, such as ROM (read-only memory) for program memory, or could use the DRAM 216 or other type of RAM for program memory and operating parameters, i.e., system memory. Each blade 602, 604 has a network module 606 (see, e.g., network interface controller 202 of FIG. 5), and the blades 602, 604 are coupled together to form the storage cluster 160. All user data is stored in storage memory on the hybrid blades 602, as described with reference to FIGS. 1-5. Usage of various numbers of hybrid blades 602 or a mixture of hybrid blades 602 and compute blades 604 in a storage system allows the amount of storage memory and processing power to be tailored to system and client needs, and allows replacements and upgrades in each or both of these aspects of system performance.

As in the embodiments of the storage cluster 160 in FIGS. 1-5, each blade 602, 604 can host or be a storage node 150, in the sense that all of the blades 602, 604 participate in at least some of the operations of the storage cluster 160. Nodes are logical constructs in a storage system, and are responsible for the behavior, intelligence, protocols, etc. in the storage system. A node can reside in a blade and make use of the physical resources in the physical blade. A hybrid blade 602 is or has therein a storage node with storage memory, and a compute blade 604 is or has therein a compute-only node without storage memory. That is, a storage node 150 on a hybrid blade 602 can use both of the computing resources and the storage memory on the hybrid blade 602, and storage memory on other hybrid blades 602, in reading and writing user data and performing other storage node tasks. A compute-only node on a compute blade 604 can use the computing resources on the compute blade 604, but may use storage memory on hybrid blades 602, as the compute blade 604 lacks storage memory. A compute-only node on a compute blade 604 uses the computing resources (including local memory, e.g., ROM and DRAM 216) on the compute blade 604, but performs computing tasks, not the storage tasks performed by the storage nodes 150, and so does not use storage memory on any of the hybrid blades 604 in the same manner that the storage nodes 150 would. There may be applications where a compute-only node could access storage memory on hybrid blades 602, for example for diagnostics, repair, or other purposes or functions outside of the usual tasks of a storage node 150. A compute-only node as described herein may be referred to as a compute node in some embodiments. Authorities 168 can reside in any storage node and thus can reside in hybrid blades 602 and/or compute blades 604. Each storage node can hold one or more authorities 168. Each authority 168 owns a range of user data, which is non-overlapping with the range of user data owned by any other authority 168, and selects and controls the erasure coding and placement of that range of user data independent of other authorities 168. In the example shown in FIG. 6, the left-most hybrid blade 602 has four authorities 168, the right-most hybrid blade 602 has four authorities 168, the left-most compute blade 604 has two authorities 168, and the right-most compute blade 604 has four authorities 168. This is by example only, and each of the blades 602, 604 could have various numbers of authorities 168, which need not be the same in each of the blades 602, 604.

Authorities 168 can be moved from one blade 602, 604 to another blade 602, 604 in various numbers and directions. In this example in FIG. 6, one of the authorities 168 is moved from the left-most hybrid blade 602 to the left-most compute blade 604, but could instead be moved to the right-most compute blade 604 (or any other compute blade 604 in the system, or to another hybrid blade 602). One of the authorities 168 is moved from the right-most hybrid blade 602 to the left-most compute blade 604. An authority on a compute blade 604 could similarly be moved to another compute blade 604 or to a hybrid blade 602, etc.

Various mechanisms for locating and/or moving an authority 168 can be developed by the person skilled in the art in keeping with the present teachings. For example, authorities 168 are shown in DRAM 216 in the various blades 602, 604. In some embodiments, various parameters, maps, accountings, records, pointers, etc., and/or a data structure implementing an authority 168 is resident in a DRAM 216 of one of the blades 602, 604, and could be moved by copying this information from the DRAM 216 of one blade 602, 604 to the DRAM 216 of another blade 602, 604. Software code that is executed to perform the actions of the authority 168 could be resident in the DRAM 216 and similarly moved. Alternatively, software code could be resident in another memory, such as a non-volatile memory, or firmware of the blade 602, 604, and executed by the CPU 156 but activated or deactivated according to one or more parameters or one or more execution threads in a multi-threading system. In one embodiment, various parameters of an authority 168 are moved from one blade 602, 604 to another blade 602, 604, and the software code in memories in each of the blades 602, 604 operates in accordance with the parameters of the authorities 168 that are resident in memory in the blades 602, 604.

Blades and 602, 604 can have differing amounts of computing or processing power, processing characteristics or computing resources. For example, different models or versions of a product may be offered, or later versions may have newer, faster, denser processors or memories, or more numerous processor cores 608, etc. In one example, one CPU 156 has four cores 608, as shown in the left-most compute blade 604, and another CPU 156 has eight cores 608, as shown in the right-most compute blade 604. One CPU 156 could have a faster clock speed than another. One DRAM 216 could have more megabytes, gigabytes or terabytes than another, or a faster access time. These factors can affect hybrid blades 602 and compute blades 604. Adding even a single compute blade 604 to a storage cluster 160 that has two or more hybrid blades 602 can boost performance of the system, and adding two or more compute blades 602 can boost the performance further. A heterogeneous system, with some number of hybrid blades 602 that have both storage and compute resources, and another number of compute blades 604 that have compute-only nodes, could be balanced differently than a homogeneous system with only hybrid blades 602. The embodiments could take advantage of the computing power or resources that is on the compute-only nodes, which do not have to dedicate any computing power or resources to storage on that same blade 604. It is worth noting that adding too many authorities 168 to a storage system that is processing limited will likely decrease performance. Adding authorities 168 (e.g., to handle a greater total amount of data) while also adding processing power 720 (e.g., by adding one or more hybrid blades 602 and/or compute blades 604) scales the system so as to preserve performance at a given level. Other examples are readily devised.

Figure 7:
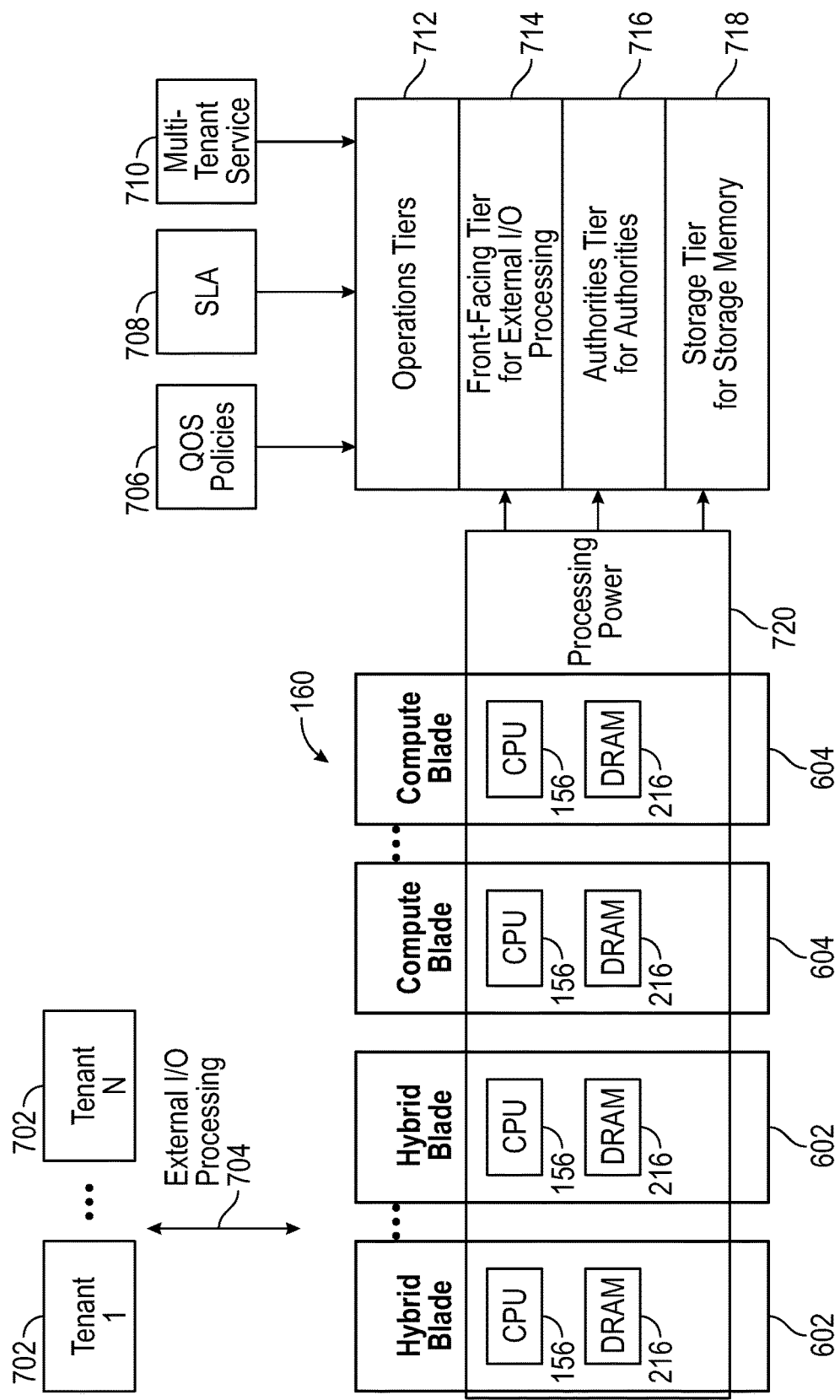
FIG. 7 is a diagram of the storage system of FIG. 6 showing processing power distributed across the hybrid blades and compute blade(s) to a front-facing tier for external I/O processing, an authorities tier for the authorities, and a storage tier for the storage memory.

FIG. 7 is a diagram of the storage system of FIG. 6 showing processing power 720 distributed across the hybrid blades 602 and compute blade(s) 604 to a front-facing tier 714 for external I/O processing, an authorities tier 716 for the authorities 168, and a storage tier 718 for the storage memory (e.g., flash memory 206 or other type of storage memory). By distributing processing power 720, it is meant that work, processing tasks, computing, computing tasks, processing or computing activity, I/O processing (external or internal), etc., is arranged, dedicated, assigned, provided for, scheduled, allocated, made available, etc., to the devices and processes in the various tiers 714, 716, 718. For example, distributing processing power 720 to the front-facing tier 714 means that the resources in the front-facing tier 714 can perform external I/O processing with a portion of the processing power 720. Distributing processing power 720 to the authorities tier 716 means that the authorities 168 can perform duties specific to the authorities 168 with a portion of the processing power 720. Distributing processing power 720 to the storage tier 718 means that the devices and processes in the storage tier 718 can perform storage duties with a portion of the processing power 720. While this example discusses various tiers, this is not meant to be limiting as this example is one example utilized for illustrative purposes. Processing power can be distributed by assigning processes or threads to specific processors or vice versa, arranging priorities of processes or threads, and in further ways readily devised in computing systems.

Multiple tenants 702 are making I/O requests, which the storage cluster 160 is handling and servicing as external I/O processing 704. Various policies and agreements 706, 708, 710 are in place in the storage system. Processing power 720 across the hybrid blade(s) 602, when there are no compute blades 604 in the system, or across the hybrid blade(s) 602 and compute blade(s) 604 when both types of blades 602, 604 are present in the system, is distributed to the operations tiers 712, e.g. the front-facing tier 714, the authorities tier 716 and the storage tier 718. It should be appreciated that this can happen in various ways, combinations and scenarios as described below.

Dedicated to receiving requests from clients for external I/O, the front-facing tier 714 decodes I/O requests and figures out where do requests go, i.e., to which authority 168 should each request be sent. This involves various calculations and maps, and takes a portion of the processing power 720. In some embodiments, an I/O request from a client, for external I/O processing, could be received in any storage node, i.e., any hybrid blade 602 or any compute blade 604. In some embodiments, I/O requests could be routed to specific blade or blades 602, 604. External I/O request processing and throughput in these embodiments is determined in accordance with the distribution of processing power 720 to the front-facing tier 714.

Next down from the front-facing tier 714, the authorities tier 716 performs the various tasks the authorities 168 require. Behavior of the system at the authorities tier 716 is as if each authority 168 is a virtual controller or processor, and this takes a further portion of the processing power 720. Distribution of the processing power 720 to and in the authorities tier 716 could be done on a per authority 168 or per blade 602, 604 basis, in various embodiments, and could be equally or evenly distributed across the authorities 168 or varied across the authorities 168 in a given blade 602, 604.

Below the authorities tier 716, the storage tier 718 takes care of tasks for which the storage memory is responsible, which takes another portion of the processing power 720. Further computing power for the storage memory is available in each of the storage units 152, e.g., from the controller 212. How the processing power is distributed to each of the tiers 714, 716, 718, and how the processing power is distributed within a given tier 714, 716, 718 is flexible and can be determined by the storage cluster 160 and/or by a user, e.g., an administrator.

In one scenario, there are initially only hybrid blades 602 in a storage cluster 160, and one or more compute blades 604 are added, for example as an upgrade or improvement. This adds to the processing power 720 available to the system. Although, in this scenario, the total amount of storage memory does not change (since no hybrid blades 602 with storage memory are added), the total of number of processors and the total amount of processing power 720 in the system is increased as a result of adding the compute blade(s) 604. Authorities 168 can be distributed, or redistributed, according to how much processing power 720 is available on each blade 602, 604. For example, if all of the CPUs 156 are equivalent in processing speed and number of cores 608, each of the blades 602, 604 could receive an equal number of authorities 168. In some embodiments, if one of the blades, be it a hybrid blade 602 or compute blade 604, has a more powerful processor (i.e., more processing power 720), that blade 602, 604 could be assigned a greater number of authorities 168. One way to distribute authorities 168 is to assign or allocate authorities to each blade 602, 604 in proportion to the relative amount of processing power 720 on that blade 602, 604. Doing so balances the processing power 720 across the authorities 168 such that each authority 168 has a comparable amount of processing power 720 accessible to that authority 168 on the blade 602, 604 on which the authority 168 resides. This can entail either adding new authorities 168 to one or more of the blades 602, 604, or moving one or more authorities 168 from one blade 602, 604 to another blade 602, 604. Referring back to the embodiment and example shown in FIG. 6, this could be the case when one or more compute blades 604 are added to the storage cluster, which triggers relocation of one or more authorities 168.

In a related scenario, the authorities are assigned, distributed, redistributed or relocated to the various blades 602, 604 in proportion to the amount of DRAM 206 (or other type of RAM or memory), or the performance of the DRAM 206

(e.g., read and write access speeds) available on each of the blades 602, 604. A blade 602, 604 with a greater amount of DRAM 206 would then receive or have a larger number of authorities than a blade 602, 604 with a lesser amount of DRAM 206. Doing so balances the RAM across the authorities 168 such that each authority 168 as a comparable amount of RAM accessible to the authority 168 on the blade 602, 604 on which the authority 168 resides.

In another scenario, portions of the total amount of the processing power 720 in all of the blades 602, 604 of a storage cluster 160 are distributed to the operations tiers 712 in accordance with quality of service (QOS) policies 706, service level agreements 708, service classes and/or multi-tenant service 710. For example, if a policy, agreement or service class is to provide a greater level of external I/O processing, e.g., a higher data throughput to and/or from data storage to one tenant 702, class of service, IP address or range of IP addresses, range of data, type of data, etc., than another, then a greater amount of processing power 720 is allocated to that tenant 702, class of service, etc., as compared to other tenants 702, classes of service, etc., in the front-facing tier 714 and/or in the authorities tier 716. Computing tasks of external I/O processing can be distributed across the blades 602, 604 so that I/O processing for each tenant 702, class of service, etc., is assigned to one or more storage nodes, which could reside on hybrid blades 602 and/or compute blades 604 in various combinations, on an individual tenant, client, application, service class, etc., basis. Computing tasks for applications in an application layer (i.e., application software distinct from the software that operates the storage cluster 160) could be distributed across one or more of the blades 602, 604, on a basis of individual applications or groups of applications and individual blades or groups of blades 602, 604, in various combinations. For example, computing tasks for one set of applications could be assigned to one group of blades 602, 604, and computing tasks for another set of applications could be assigned to another group of blades 602, 604, and these could be overlapping or non-overlapping groups. Authorities 168 for the inodes of data belonging to a tenant 702, class of service, etc., could be assigned a greater proportion of the processor cores 608, weighted by clock frequency or processor speed, as compared to other tenants 702, classes of service, etc., for example by moving authorities 168 appropriately. The system could balance how much processing power 720 is available for the authorities 168 versus the storage memory, for example by controlling the number of threads launched or weighting the threads as to priority. Amount of storage guaranteed to a tenant 702 and quality of service (e.g., throughput, latency, responsiveness) can be adjusted orthogonally (i.e., independently), on a steady, elastic, or demand basis in the system. In some embodiments, heuristics can be applied to measuring and adjusting these and other aspects of the system. Changes to policies, agreements, or tenants could also trigger relocation of one or more authorities 168.

Figure 8:
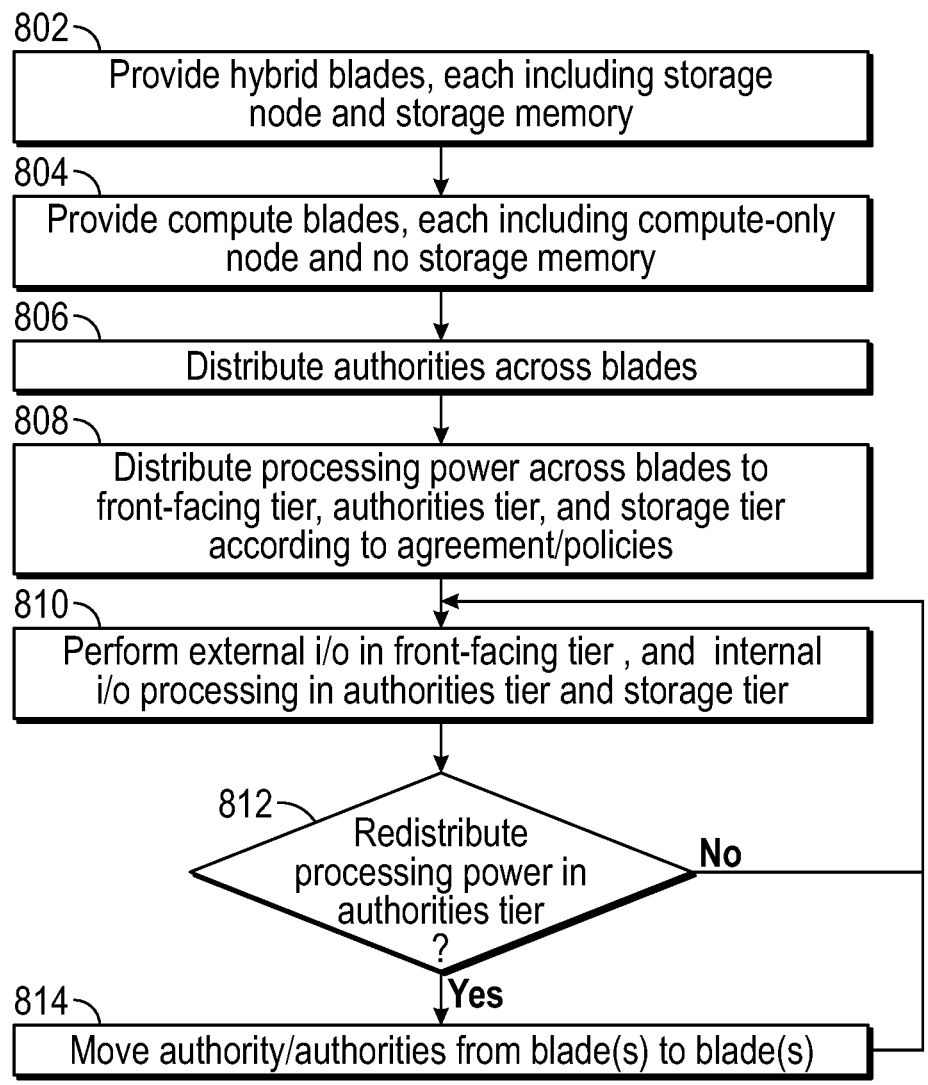
FIG. 8 is a flow diagram of a method for managing processing power in a storage system, which can be practiced on or by embodiments of the storage cluster, storage nodes and/or non-volatile solid state storages in accordance with some embodiments.

FIG. 8 is a flow diagram for a method of managing processing power in a storage system. The method can be practiced on or by various embodiments of a storage cluster and storage nodes as described herein. Various steps of the method can be performed by a processor, such as a processor in a storage cluster or a processor in a storage node. Portions or all of the method can be implemented in software, hardware, firmware or combinations thereof. The method initiates with action 802, in which hybrid blades are provided. Each hybrid blade includes a storage node and storage memory. In an action 804, compute blades are provided. Each compute blade includes a compute-only node and no storage memory. The compute blade has system memory, such as DRAM or other RAM, but does not have solid-state storage memory or disk-based storage memory on the compute blade itself. Authorities are distributed across the blades, in an action 806. That is, authorities are located on, moved to or otherwise established on the hybrid blades and compute blades.

In an action 808, processing power is distributed across the blades to a tier, e.g., a front-facing tier, an authorities tier, and a storage tier, according to agreements and/or policies as mentioned above. Depending on what is in the agreements or policies, processing power could be distributed to each of the tiers in fixed or variable amounts. The front-facing tier services external I/O requests, i.e., is for external I/O processing, the authorities tier is for servicing the authorities, and the storage tier is for servicing the storage memory in this embodiment.

In an action 810, external I/O processing is performed in the front-facing tier, and internal I/O processing (i.e., processing of internal I/O operations relating to various resources in the storage system) is performed in the authorities tier and the storage tier. In a decision action 812, the question is asked, should processing power be redistributed in the authorities tier? If the answer is no, there is no need to redistribute processing power in the authorities tier, flow branches back to the action 810, to continue performing external and internal I/O processing. If the answer is yes, processing power is to be redistributed in the authorities tier, flow proceeds to the action 814. This could be triggered, for example, by insertion of a compute blade into the storage cluster, insertion of a hybrid blade, or changes to policies, agreements or multi-tenant service.

In the action 814, an authority is moved from one blade to another blade (e.g., a hybrid blade to a compute blade, a hybrid blade to another hybrid blade, a compute blade to another compute blade, or even from a compute blade to a hybrid blade). In some embodiments more than one authority is moved among the blades. In a variation, processing power among the tiers, or within one of the tiers, could be redistributed in response to changes in agreements or policies, or insertion of a blade. Flow then returns to the action 810, to continue performing external and internal I/O processing. In variations, flow could proceed elsewhere to perform further actions.

Figure 9:
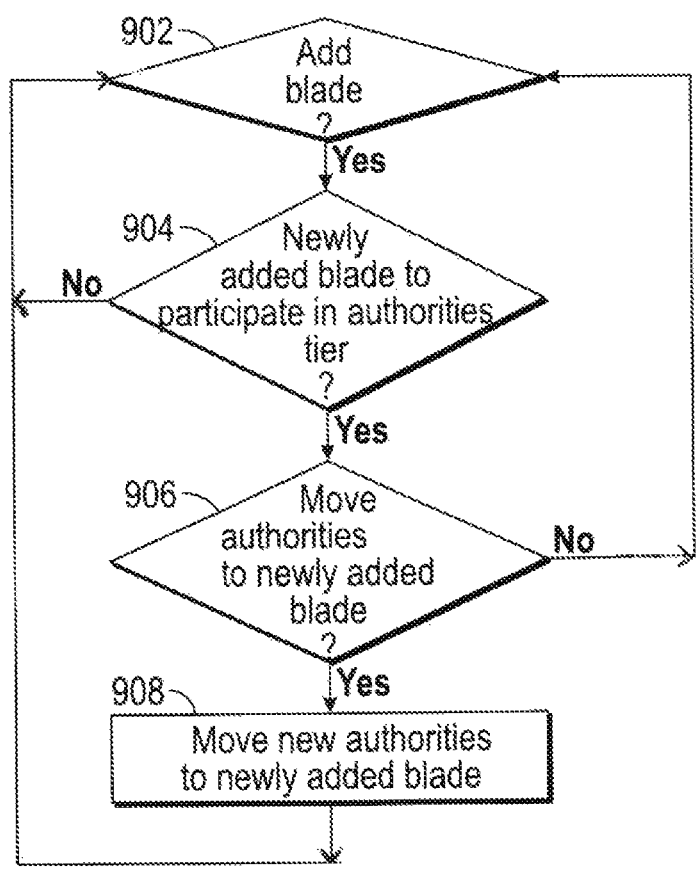
FIG. 9 is a flow diagram of a method for managing processing power in a storage system upon addition of a blade, which can be practiced on or by embodiments of the storage cluster, storage nodes and/or non-volatile solid-state storage is in accordance with some embodiments.

FIG. 9 is a flow diagram of a method for managing processing power in a storage system upon addition of a blade, which can be practiced on or by embodiments of the storage cluster, storage nodes and/or non-volatile solid-state storages in accordance with some embodiments. The method is related to that of FIG. 8, and in variations could be combined with or replace portions of the method described with reference to FIG. 8. The method begins with a decision action 902, in which it is determined whether to add a blade to the storage system. If the answer is no, no blade should be or is added, the method may wait for a period of time and check if a blade is to be added in some embodiments. If the answer is yes, a blade is added, flow proceeds to the decision action 904. In the decision action 904, is determined whether the newly added blade is to participate in the authorities tier. For example, it could be decided that the newly added blade will have a compute-only node, but does not participate in the authorities tier. Or, it could be decided that the newly added blade will have a compute-only storage node, and participate in actions performed by or on behalf of authorities as participation in the authorities tier. If the answer is no, the newly added blade is not to participate in the authorities tier, flow proceeds to the decision action 902. If the answer is yes, the newly added blade is to participate in the authorities tier, flow proceeds to the decision action 906.

In the decision action 906, it is determined whether to move new authorities to the newly added blade. If the answer is yes, flow proceeds to the action 908, in which new authorities are moved or added to the newly added blade. As mentioned above the movement of authorities from one or more blades to one or more further blades will redistribute the processing power as desired. Flow branches back to the action 902, to see if a blade is being added or will be added. In variations, flow could branch elsewhere to perform further tasks. In the case where the decision action 904 determined that the newly added blade is not to participate in the authorities tier, the newly added blade could be excluded from receiving any of the moved authorities, or the decision could be revisited, in which case the newly added blade could receive one or more of the moved authorities. After authorities are moved, flow proceeds back to the action 902, or in variations, branches elsewhere to perform further tasks.

Figure 10:
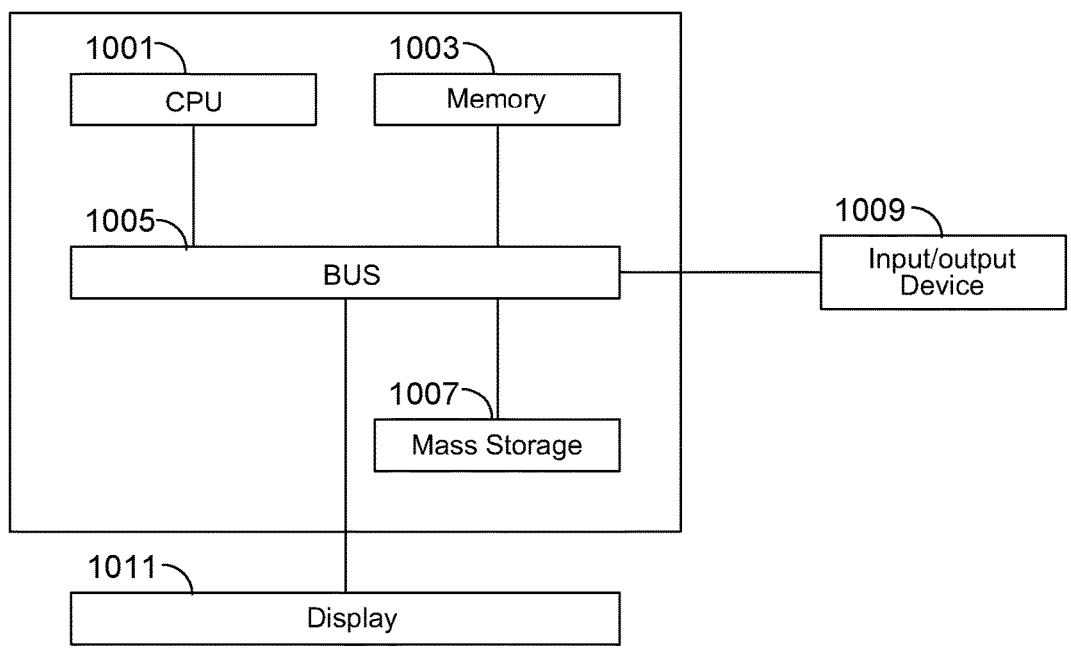
FIG. 10 is an illustration showing an exemplary computing device which may implement the embodiments described herein.

It should be appreciated that the methods described herein may be performed with a digital processing system, such as a conventional, general-purpose computer system. Special purpose computers, which are designed or programmed to perform only one function may be used in the alternative. FIG. 10 is an illustration showing an exemplary computing device which may implement the embodiments described herein. The computing device of FIG. 10 may be used to perform embodiments of the functionality for the managing processing power in a storage system in accordance with some embodiments. The computing device includes a central processing unit (CPU) 1001, which is coupled through a bus 1005 to a memory 1003, and mass storage device 1007. Mass storage device 1007 represents a persistent data storage device such as a floppy disc drive or a fixed disc drive, which may be local or remote in some embodiments. Memory 1003 may include read only memory, random access memory, etc. Applications resident on the computing device may be stored on or accessed via a computer readable medium such as memory 1003 or mass storage device 1007 in some embodiments. Applications may also be in the form of modulated electronic signals modulated accessed via a network modem or other network interface of the computing device. It should be appreciated that CPU 1001 may be embodied in a general-purpose processor, a special purpose processor, or a specially programmed logic device in some embodiments.

Display 1011 is in communication with CPU 1001, memory 1003, and mass storage device 1007, through bus 1005. Display 1011 is configured to display any visualization tools or reports associated with the system described herein. Input/output device 1009 is coupled to bus 1005 in order to communicate information in command selections to CPU 1001. It should be appreciated that data to and from external devices may be communicated through the input/output device 1009. CPU 1001 can be defined to execute the functionality described herein to enable the functionality described with reference to FIGS. 1-9. The code embodying this functionality may be stored within memory 1003 or mass storage device 1007 for execution by a processor such as CPU 1001 in some embodiments. The operating system on the computing device may be MS DOS™, MS-WINDOWS™ OS/2™, UNIX™, LINUX™, or other known operating systems. It should be appreciated that the embodiments described herein may also be integrated with a virtualized computing system implemented with physical computing resources.

Detailed illustrative embodiments are disclosed herein. However, specific functional details disclosed herein are merely representative for purposes of describing embodiments. Embodiments may, however, be embodied in many alternate forms and should not be construed as limited to only the embodiments set forth herein.

It should be understood that although the terms first, second, etc. may be used herein to describe various steps or calculations, these steps or calculations should not be limited by these terms. These terms are only used to distinguish one step or calculation from another. For example, a first calculation could be termed a second calculation, and, similarly, a second step could be termed a first step, without departing from the scope of this disclosure. As used herein, the term "and/or" and the "/" symbol includes any and all combinations of one or more of the associated listed items.

As used herein, the singular forms "a", "an" and "the" are intended to include the plural forms as well, unless the context clearly indicates otherwise. It will be further understood that the terms "comprises", "comprising", "includes", and/or "including", when used herein, specify the presence of stated features, integers, steps, operations, elements, and/or components, but do not preclude the presence or addition of one or more other features, integers, steps, operations, elements, components, and/or groups thereof. Therefore, the terminology used herein is for the purpose of describing particular embodiments only and is not intended to be limiting.

It should also be noted that in some alternative implementations, the functions/acts noted may occur out of the order noted in the figures. For example, two figures shown in succession may in fact be executed substantially concurrently or may sometimes be executed in the reverse order, depending upon the functionality/acts involved.

With the above embodiments in mind, it should be understood that the embodiments might employ various computer-implemented operations involving data stored in computer systems. These operations are those requiring physical manipulation of physical quantities. Usually, though not necessarily, these quantities take the form of electrical or magnetic signals capable of being stored, transferred, combined, compared, and otherwise manipulated. Further, the manipulations performed are often referred to in terms, such as producing, identifying, determining, or comparing. Any of the operations described herein that form part of the embodiments are useful machine operations. The embodiments also relate to a device or an apparatus for performing these operations. The apparatus can be specially constructed for the required purpose, or the apparatus can be a general-purpose computer selectively activated or configured by a computer program stored in the computer. In particular, various general-purpose machines can be used with computer programs written in accordance with the teachings herein, or it may be more convenient to construct a more specialized apparatus to perform the required operations.

A module, an application, a layer, an agent or other method-operable entity could be implemented as hardware, firmware, or a processor executing software, or combinations thereof. It should be appreciated that, where a software-based embodiment is disclosed herein, the software can be embodied in a physical machine such as a controller. For example, a controller could include a first module and a second module. A controller could be configured to perform various actions, e.g., of a method, an application, a layer or an agent.

The embodiments can also be embodied as computer readable code on a non-transitory computer readable medium. The computer readable medium is any data storage device that can store data, which can be thereafter read by a computer system. Examples of the computer readable medium include hard drives, network attached storage (NAS), read-only memory, random-access memory, CD-ROMs, CD-Rs, CD-RWs, magnetic tapes, and other optical and non-optical data storage devices. The computer readable medium can also be distributed over a network coupled computer system so that the computer readable code is stored and executed in a distributed fashion. Embodiments described herein may be practiced with various computer system configurations including hand-held devices, tablets, microprocessor systems, microprocessor-based or programmable consumer electronics, minicomputers, mainframe computers and the like. The embodiments can also be practiced in distributed computing environments where tasks are performed by remote processing devices that are linked through a wire-based or wireless network.

Although the method operations were described in a specific order, it should be understood that other operations may be performed in between described operations, described operations may be adjusted so that they occur at slightly different times or the described operations may be distributed in a system which allows the occurrence of the processing operations at various intervals associated with the processing.

In various embodiments, one or more portions of the methods and mechanisms described herein may form part of a cloud-computing environment. In such embodiments, resources may be provided over the Internet as services according to one or more various models. Such models may include Infrastructure as a Service (IaaS), Platform as a Service (PaaS), and Software as a Service (SaaS). In IaaS, computer infrastructure is delivered as a service. In such a case, the computing equipment is generally owned and operated by the service provider. In the PaaS model, software tools and underlying equipment used by developers to develop software solutions may be provided as a service and hosted by the service provider. SaaS typically includes a service provider licensing software as a service on demand. The service provider may host the software, or may deploy the software to a customer for a given period of time. Numerous combinations of the above models are possible and are contemplated.

Various units, circuits, or other components may be described or claimed as "configured to" perform a task or tasks. In such contexts, the phrase "configured to" is used to connote structure by indicating that the units/circuits/components include structure (e.g., circuitry) that performs the task or tasks during operation. As such, the unit/circuit/component can be said to be configured to perform the task even when the specified unit/circuit/component is not currently operational (e.g., is not on). The units/circuits/components used with the "configured to" language include hardware—for example, circuits, memory storing program instructions executable to implement the operation, etc. Reciting that a unit/circuit/component is "configured to" perform one or more tasks is expressly intended not to invoke 35 U.S.C. 112, sixth paragraph, for that unit/circuit/component. Additionally, "configured to" can include generic structure (e.g., generic circuitry) that is manipulated by software and/or firmware (e.g., an FPGA or a general-purpose processor executing software) to operate in manner that is capable of performing the task(s) at issue. "Configured to" may also include adapting a manufacturing process (e.g., a semiconductor fabrication facility) to fabricate devices (e.g., integrated circuits) that are adapted to implement or perform one or more tasks.

The foregoing description, for the purpose of explanation, has been described with reference to specific embodiments. However, the illustrative discussions above are not intended to be exhaustive or to limit the invention to the precise forms disclosed. Many modifications and variations are possible in view of the above teachings. The embodiments were chosen and described in order to best explain the principles of the embodiments and its practical applications, to thereby enable others skilled in the art to best utilize the embodiments and various modifications as may be suited to the particular use contemplated. Accordingly, the present embodiments are to be considered as illustrative and not restrictive, and the invention is not to be limited to the details given herein, but may be modified within the scope and equivalents of the appended claims.

What is claimed is:

1. A method for managing processing power in a storage system, comprising:
   providing a plurality of blades, each of a first subset having a storage node and storage memory, and each of a second, differing subset having a compute-only node; and
   distributing authorities across the plurality of blades, to a plurality of nodes including at least one compute-only node, wherein each authority has ownership of a range of user data.

2. The method of claim 1, further comprising:
   adding another blade having a compute-only node; and
   re-distributing the authorities across the plurality of blades and the another blade.

3. The method of claim 1, wherein the distributing the authorities comprises:
   moving one or more authorities from one or more of the plurality of blades to a further one of the plurality of blades, responsive to adding the further one of the plurality of blades to the storage system.

4. The method of claim 1, wherein the distributing the authorities is in accordance with balancing computing resources across the authorities, for each of the plurality of blades.

5. The method of claim 1, further comprising:
   distributing computing tasks of external I/O (input/output) processing across the plurality of blades so that I/O processing for each of a plurality of classes of service is assigned to one or more storage nodes or compute nodes on an individual service class basis.

6. The method of claim 1, wherein:
   the plurality of blades includes a first blade having a first set of processing characteristics including an amount of random access memory (RAM), processor speed or number of processor cores and a second blade having a second set of processing characteristics including an amount of RAM, processor speed or number of processor cores; and
   a greater number of authorities is distributed to the second blade than to the first blade so as to balance the processing characteristics available to authorities of the first blade and authorities of the second blade.

7. The method of claim 1, wherein:
computing tasks of one or more applications in an application layer are distributed across at least one of the plurality of blades; and
the distributing the authorities is in proportion to relative amount of processing power available at each of the plurality of blades.

8. A tangible, non-transitory, computer-readable media having instructions thereupon which, when executed by a processor, cause the processor to perform a method comprising:
providing a plurality of blades, each of a first subset having a storage node and storage memory, and each of a second, differing subset having a compute-only node; and
distributing authorities across the plurality of blades, to a plurality of nodes including at least one compute-only node, wherein each authority has ownership of a range of user data.

9. The computer-readable media of claim 8, wherein the method further comprises:
adding another blade having a compute-only node; and
re-distributing the authorities across the plurality of blades and the another blade.

10. The computer-readable media of claim 8, wherein the distributing the authorities comprises:
moving one or more authorities from one or more of the plurality of blades to a further one of the plurality of blades, responsive to adding the further one of the plurality of blades to the storage system.

11. The computer-readable media of claim 8, wherein the distributing the authorities is in accordance with balancing computing resources across the authorities, for each of the plurality of blades.

12. The computer-readable media of claim 8, wherein the method further comprises:
distributing computing tasks of external I/O (input/output) processing across the plurality of blades so that I/O processing for each of a plurality of classes of service is assigned to one or more storage nodes or compute nodes on an individual service class basis.

13. The computer-readable media of claim 8, wherein:
the plurality of blades includes a first blade having a first set of processing characteristics including an amount of random access memory (RAM), processor speed or number of processor cores and a second blade having a second set of processing characteristics including an amount of RAM, processor speed or number of processor cores; and
a greater number of authorities is distributed to the second blade than to the first blade so as to balance the processing characteristics available to authorities of the first blade and authorities of the second blade.

14. A storage system, comprising:
a plurality of blades, each of a first subset having a storage node and storage memory, and each of a second, differing subset having a compute-only node; and
the plurality of blades forming the storage system, wherein authorities are distributed across the plurality of blades, to a plurality of nodes including at least one compute-only node, and wherein each authority has ownership of a range of user data.

15. The storage system of claim 14, configured to:
add another blade having a compute-only node; and
re-distribute the authorities across the plurality of blades and the another blade.

16. The storage system of claim 14, wherein the plurality of blades are configured to distribute the authorities by moving one or more authorities from one or more of the plurality of blades to a further one of the plurality of blades, responsive to adding the further one of the plurality of blades to the storage system.

17. The storage system of claim 14, wherein the authorities are distributed in accordance with balancing computing resources across the authorities, for each of the plurality of blades.

18. The storage system of claim 14, wherein:
computing tasks of external I/O (input/output) processing are distributed across the plurality of blades so that I/O processing for each of a plurality of classes of service is assigned to one or more storage nodes or compute nodes on an individual service class basis.

19. The storage system of claim 14, wherein:
the plurality of blades includes a first blade having a first set of processing characteristics including amount of random access memory (RAM), processor speed or number of processor cores and a second blade having a second set of processing characteristics including an amount of RAM, processor speed or number of processor cores; and
a greater number of authorities is distributed to the second blade than to the first blade so as to balance the processing characteristics available to authorities of the first blade and authorities of the second blade.

20. The storage system of claim 14, wherein:
computing tasks of one or more applications in an application layer are distributed across at least one of the plurality of blades; and
the distributing the authorities is in proportion to relative amount of processing power available at each of the plurality of blades.

* * * * *